(12) United States Patent
Kuramochi

(10) Patent No.: US 8,941,521 B2
(45) Date of Patent: Jan. 27, 2015

(54) ANALOG TO DIGITAL CONVERTER AND DIGITAL TO ANALOG CONVERTER

(71) Applicant: Advantest Corporation, Tokyo (JP)

(72) Inventor: Yasuhide Kuramochi, Gunma (JP)

(73) Assignee: Advantest Corporation, Tokyo (JP)

( * ) Notice: Subject to any disclaimer, the term of this patent is extended or adjusted under 35 U.S.C. 154(b) by 184 days.

(21) Appl. No.: 13/752,398

(22) Filed: Jan. 29, 2013

(65) Prior Publication Data
US 2013/0141266 A1 Jun. 6, 2013

Related U.S. Application Data

(62) Division of application No. 13/253,973, filed on Oct. 6, 2011, now Pat. No. 8,378,873.

(30) Foreign Application Priority Data

Dec. 9, 2010 (JP) ................................ 2010-274866

(51) Int. Cl.
*H03M 1/82* (2006.01)
*H03M 1/66* (2006.01)
*H03M 1/46* (2006.01)

(52) U.S. Cl.
CPC .............. *H03M 1/664* (2013.01); *H03M 1/462* (2013.01); *H03M 1/822* (2013.01)
USPC ........... 341/152; 714/719; 714/710; 714/731; 714/726; 714/733; 365/200; 365/201; 257/202; 257/207; 257/208; 257/210; 257/211; 327/202; 341/165

(58) Field of Classification Search
CPC ...... H03M 1/664; H03M 1/462; H03M 1/822
USPC .......... 341/155–165; 714/320, 710, 731, 726, 714/733, 719; 365/200, 201; 257/202, 207, 257/208, 210, 211; 327/202
See application file for complete search history.

(56) References Cited

U.S. PATENT DOCUMENTS 5,262,873 A * 11/1993 Ishizuka ........................ 358/443
6,956,516 B2 * 10/2005 Furuichi ........................ 341/155

(Continued)

FOREIGN PATENT DOCUMENTS

JP S58-161530 A 9/1983
JP 62-209925 A 9/1987

(Continued)

OTHER PUBLICATIONS

Chun-Cheng Liu; Soon-Jyh Chang; Guan-Ying Huang; Ying-Zulin;, "A 10-bit 50-MS/s SAR ADC With a Monotonic Capacitor Switching Procedure," Solid-State Circuits, IEEE Journal of, vol. 45, No. 4, pp. 731-740, Apr. 2010.

(Continued)

*Primary Examiner* — Lam T Mai

(57) ABSTRACT

To decrease the burden of digital processing, provided is an AD conversion apparatus comprising a pattern generating section that, for each target bit specified one bit at a time moving downward in the output data, generates a pattern signal having a pulse width or number of pulses corresponding to a weighting of the target bit; an integrating section that integrates the pattern signals according to a judgment value for judging a value of the target bit each time a pattern signal is generated, and outputs a reference signal obtained by accumulating the integrated value of each pattern signal; a comparing section that, each time generation of a pattern signal is finished, compares the input signal to the reference signal; and an output section that outputs the output data to have values corresponding to the comparison results obtained after each generation of a pattern signal corresponding to a bit is finished.

11 Claims, 18 Drawing Sheets

(56) References Cited

U.S. PATENT DOCUMENTS

| | | | |
|---|---|---|---|
| 7,155,643 B2* | 12/2006 | Ichikawa | 714/710 |
| 7,174,489 B2* | 2/2007 | Sadakata et al. | 714/719 |
| 7,348,913 B2* | 3/2008 | Kawabata | 341/148 |
| 7,518,936 B2* | 4/2009 | Kobatake | 365/200 |
| 7,590,908 B2* | 9/2009 | Ishimura et al. | 714/726 |
| 7,610,533 B2* | 10/2009 | Ishimura et al. | 714/726 |

FOREIGN PATENT DOCUMENTS

| | | |
|---|---|---|
| JP | H05-160727 A | 6/1993 |
| JP | H05-243998 A | 9/1993 |
| JP | H06-2836 U | 1/1994 |
| JP | H06-12502 A | 1/1994 |
| JP | H06-104763 A | 4/1994 |
| JP | H07-131353 A | 5/1995 |
| JP | H07-312553 A | 11/1995 |
| JP | 09-64747 A | 3/1997 |
| JP | H11-205150 A | 7/1999 |
| JP | 2000-357968 A | 12/2000 |
| JP | 2002-111499 A | 4/2002 |
| JP | 2003-032114 A | 1/2003 |
| JP | 2003-143011 A | 5/2003 |

OTHER PUBLICATIONS

"A 0.92mW 10-bit 50-MS/s SAR ADC in 0.13μm CMOS Process," IEEE Symposium on VLSI Circuits, pp. 236-237, 2009. (Jun. 16-18, 2009, Kyoto, Japan).

Notice of Reasons for Rejection for Japanese Patent Application No. 2010-274866, issued by the Japanese Patent Office on Aug. 2, 2013.

* cited by examiner

ANALOG TO DIGITAL CONVERTER AND DIGITAL TO ANALOG CONVERTER

BACKGROUND

1. Technical Field

The present invention relates to an AD conversion apparatus and a DA conversion apparatus.

2. Related Art

Citation 1 discloses a successive approximation AD converter that uses a PWM circuit and a smoothing circuit. Citations 2 and 3 each disclose an integration AD converter. Citation 4 discloses a sigma-delta AD converter.

Citation 5 discloses a DA converter that charges/discharges a capacitor according to a 1-bit up/down signal. Citation 6 discloses a DA converter that generates in parallel N stages of pulses whose periods each differ by $2^N$ times, and adds these pulses together.

Patent Document 1: Japanese Patent Application Publication No. H07-131353
Patent Document 2: Japanese Patent Application Publication No. 2003-32114
Patent Document 3: Japanese Patent Application Publication No. 2003-143011
Patent Document 4: Japanese Patent Application Publication No. 2000-357968
Patent Document 5: Japanese Patent Application Publication No. 2002-111499
Patent Document 6: Japanese Patent Application Publication No. H06-104763

However, in order to generate a threshold voltage for determining the value of each bit, the successive approximation AD converter must feed back the comparison results and perform a digital computation. In order to count a clock, for example, the integration AD converter must perform a digital adding process. In order to generate a pulse modulation signal, the sigma-delta AD converter must perform a modulation process and an addition/subtraction process according to the comparison results. These AD converters therefore have large digital circuits.

In order to generate the desired voltage, the DA converter of Citation 5 must perform a digital process such as counting the up/down signals. The DA converter of Citation 6 must include N pulse generators.

SUMMARY

In order to solve the above problems, according to a first aspect related to the innovations herein, provided is an AD conversion apparatus that converts an analog input signal into digital output data, comprising a pattern generating section that, for each target bit specified one bit at a time moving downward in the output data, generates a pattern signal having a pulse width or number of pulses corresponding to a weighting of the target bit; an integrating section that integrates the pattern signals according to a judgment value for judging a value of the target bit each time a pattern signal is generated, and outputs a reference signal obtained by accumulating the integrated value of each pattern signal; a comparing section that, each time generation of a pattern signal is finished, compares the input signal to the reference signal; and an output section that outputs the output data to have values corresponding to the comparison results obtained after each generation of a pattern signal corresponding to a bit is finished. From a second bit that is immediately below the most significant bit in the output data and onward, the integrating section integrates each pattern signal according to the judgment value based on the comparison result obtained after the generation of the immediately prior pattern signal.

According to a second aspect related to the innovations herein, provided is a DA conversion apparatus that converts digital input data into an analog output signal, comprising a pattern generating section that, for each target bit specified one bit at a time in the input data, generates a pattern signal having a pulse width or number of pulses corresponding to a weighting of the target bit; and an integrating section that integrates the pattern signals corresponding to values of the target bits to output the output signal obtained by accumulating the integrated value of each pattern signal from the most significant bit to the least significant bit of the input data.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
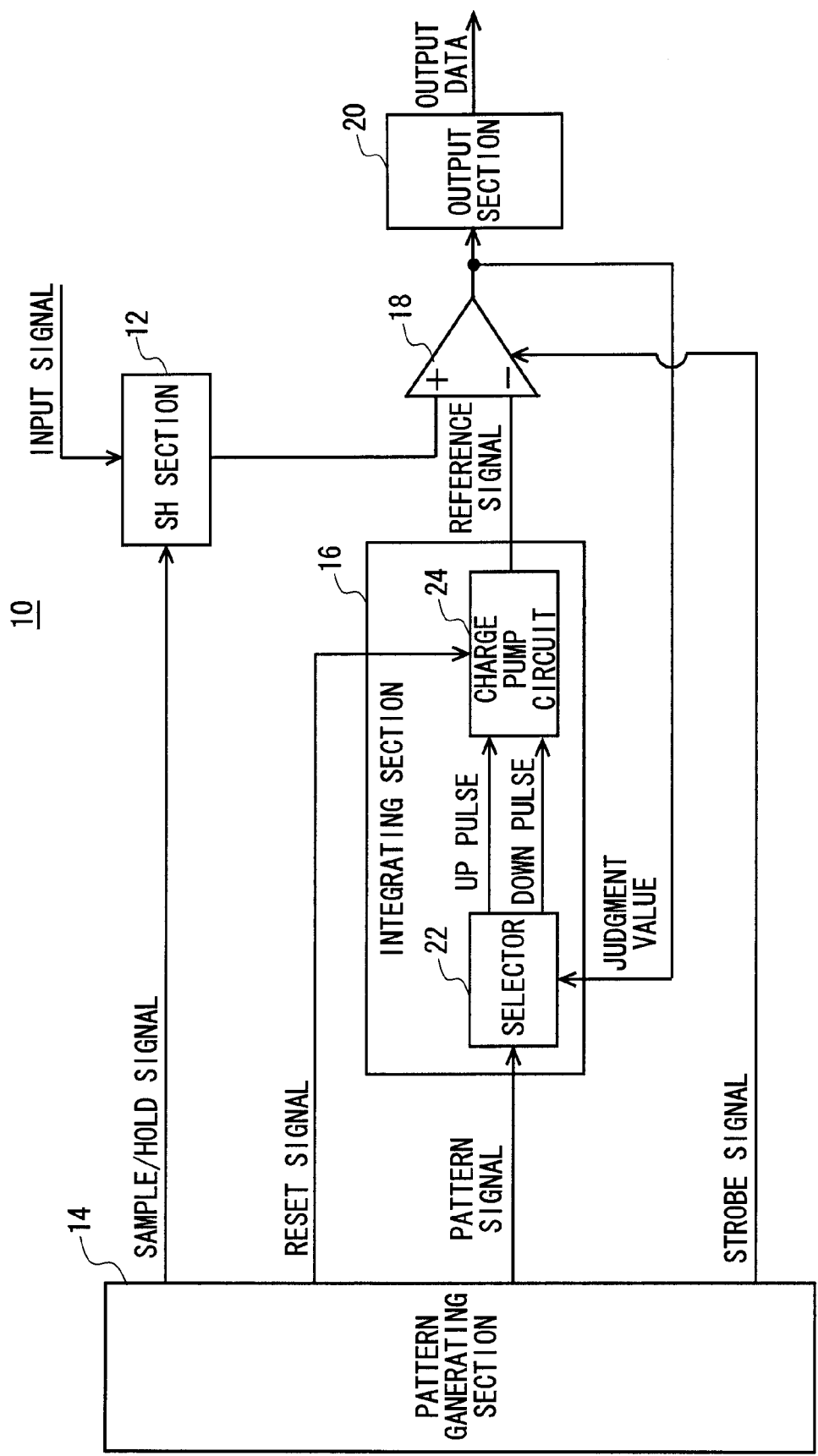
FIG. 1 shows a configuration of an AD conversion apparatus 10 according to an embodiment of the present invention.

FIG. 1 shows a configuration of an AD conversion apparatus 10 according to an embodiment of the present invention. The AD conversion apparatus 10 converts an analog input signal into digital output data having a prescribed number of bits.

The AD conversion apparatus 10 includes a sample/hold section 12, a pattern generating section 14, an integrating section 16, a comparing section 18, and an output section 20.

The sample/hold section 12 samples the input signal in synchronization with a sample/hold signal, and holds the sampled input signal. The sample/hold section 12 supplies the held input signal to a first terminal, e.g. a positive input terminal, of the comparing section 18. If the frequency of the input signal is sufficiently low, the AD conversion apparatus 10 need not include the sample/hold section 12.

The pattern generating section 14 supplies the sample/hold section 12 with the sample/hold signal designating a sampling period and a holding period. The sample/hold section 12 samples the input signal during the sampling period designated by the sample/hold signal. During the holding period designated by the sample/hold signal, the sample/hold section 12 holds the input signal sampled during the immediately prior sampling period.

During the holding period, for each of a plurality of target bits specified downward 1 bit at a time in the output data, the pattern generating section 14 generates a pattern signal with a pulse width or number of pulses corresponding to a weighting of the target bit.

For example, first, the pattern generating section 14 outputs a pattern signal with a pulse width (or number of pulses) corresponding to the weighting of the most significant bit. Next, after a prescribed interval, the pattern generating section 14 outputs a pattern signal with a pulse width (or number of pulses) corresponding to the bit that is 1 bit below the most significant bit. Then, after a prescribed interval, the pattern generating section 14 outputs a pattern signal with a pulse width (or number of pulses) corresponding to the bit that is 2 bits below the most significant bit.

After this, the pattern generating section 14 sequentially outputs pattern signals that respectively have a pulse width (or number of pulses) corresponding to the weighting of each bit of the output data while moving the target bit downward 1 bit at a time. After outputting the pattern signal with a pulse width (or number of pulses) corresponding to the weighting of the least significant bit, the pattern generating section 14 stops outputting the pattern signal.

Prior to outputting the pattern signal corresponding to the most significant bit of the output data, the pattern generating section 14 generates a reset signal for resetting a reference signal to an initial value. The pattern generating section 14 supplies the reset signal to the integrating section 16.

For each pattern signal, after the generation of the pattern signal is finished and before the generation of the next pattern signal, the pattern generating section 14 generates a strobe signal indicating a comparison timing. The pattern generating section 14 supplies the strobe signal to the comparing section 18.

Prior to the generation of each pattern signal, the integrating section 16 receives a judgment value for judging the value of the target bit. When the target bit is the most significant bit of the output data, the integrating section 16 receives a predetermined value as the judgment value. When the target bit is the second bit of the output data, i.e. the bit immediately below the most significant bit, the integrating section 16 receives, as the judgment value, the result of the comparison between the reference signal and the input signal after the immediately prior pattern signal is generated.

Each time a pattern signal is generated, the integrating section 16 integrates the pattern signal using integral gain with a sign corresponding to the judgment value. More specifically, when the judgment value indicates that the input signal is greater than the reference signal, e.g. a first logic value, the integrating section 16 integrates the pattern signal with an integral gain having a sign that causes the reference signal to increase. When the judgment value indicates that the input signal is not greater than the reference signal, e.g. a second logic value, the integrating section 16 integrates the pattern signal with an integral gain having a sign that causes the reference signal to increase. The integrating section 16 outputs the reference signal corresponding to the value obtained by accumulating the integrated value of each pattern signal.

The integrating section 16 may include a selector 22 and a charge pump circuit 24. The selector 22 outputs an UP pulse having the same pulse width or number of pulses as the pattern signal when the judgment value is the first logic value. The selector 22 outputs a DOWN pulse having the same pulse width or number of pulses as the pattern signal when the judgment value is the second logic value.

When an UP pulse is received, the charge pump circuit 24 integrates the UP pulse with a positive integral gain, and adds the result to the voltage of the reference signal. When a DOWN pulse is received, the charge pump circuit 24 integrates the DOWN pulse with a negative integral gain, and adds the result to the voltage of the reference signal. With the above configuration, the integrating section 16 can output, as the reference signal, the integrated voltage obtained by integrating the pattern signal with a sign corresponding to the judgment value.

The comparing section 18 compares the input signal to the reference signal, each time a pattern signal is generated. In the present embodiment, the comparing section 18 judges whether the input signal is larger than the reference signal, at each timing of the strobe signal. The comparing section 18 supplies the integrating section 16 and the output section 20 with the judgment value corresponding to each comparison result.

The output section 20 receives from the comparing section 18 the comparison result output each time generation of a pattern signal is finished. The output section 20 records a value corresponding to each received comparison result in a register, for example, in association with each bit of the output data. After the comparison result for the pattern signal of the least significant bit of the output data has been received, the output section 20 outputs output data in which the value of each bit corresponds to the comparison result obtained after the generation of the corresponding pattern signal.

Figure 2:
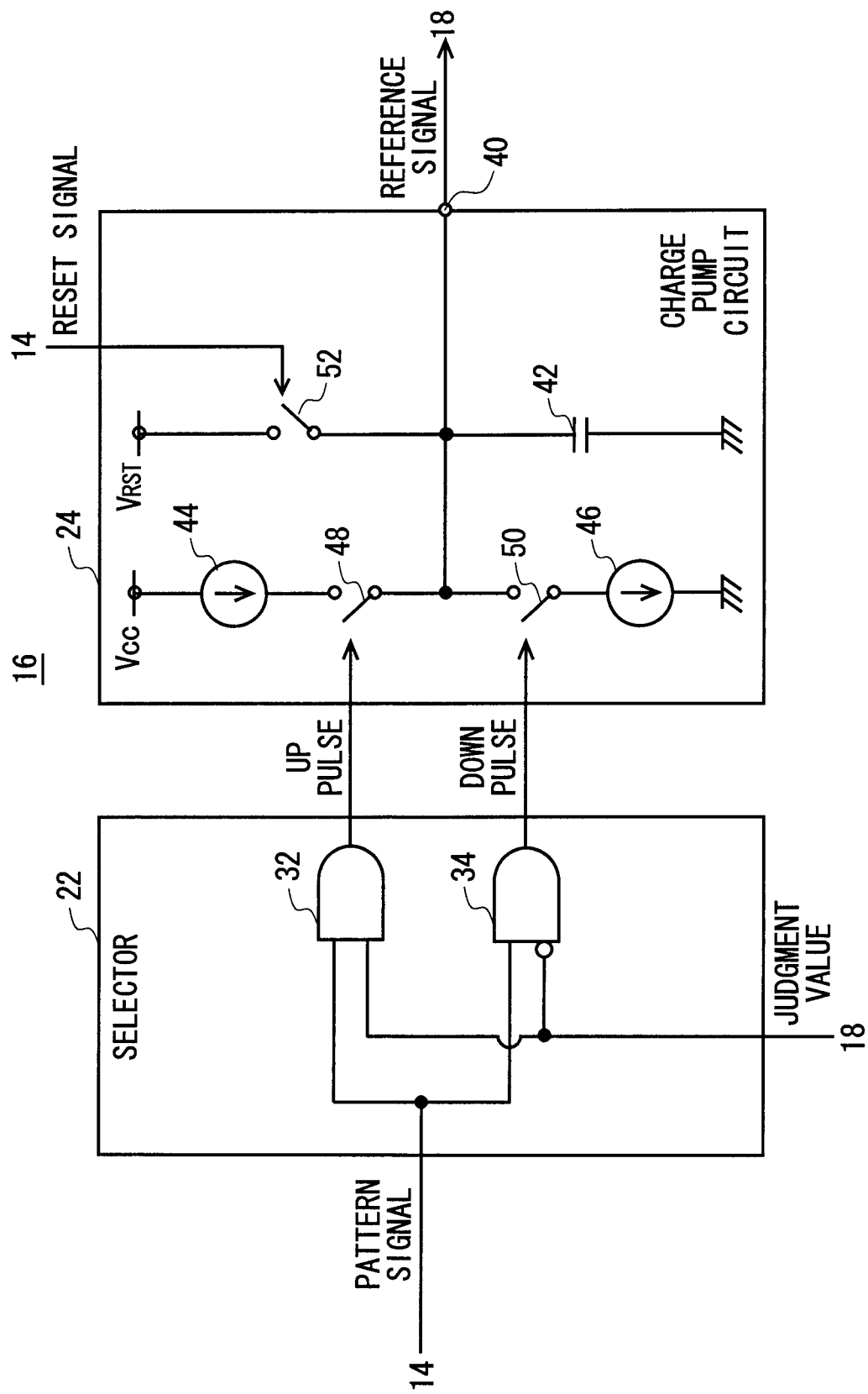
FIG. 2 shows an exemplary configuration of the integrating section 16 according to the present embodiment.

FIG. 2 shows an exemplary configuration of the integrating section 16 according to the present embodiment. The integrating section 16 may have the circuit configuration shown in FIG. 2.

The selector 22 includes an UP-side AND gate 32 and a DOWN-side AND gate 34. The selector 22 receives the pattern signals from the pattern generating section 14. The selector 22 receives the judgment value from the comparing section 18.

The UP-side AND gate 32 outputs, as the UP pulse, a signal obtained as the AND of the pattern signal and the judgment value. In other words, when the received judgment value is the first logic value, i.e. a value indicating that the input signal is greater than the reference signal, the UP-side AND gate 32 transmits the pattern signal to be output as the UP pulse. When the received judgment value is the second logic value, i.e. a value indicating that the input signal is not greater than the reference signal, the UP-side AND gate 32 does not output an UP pulse.

The DOWN-side AND gate 34 outputs, as the DOWN pulse, a signal obtained as the AND of the pattern signal and the inverse of the judgment value. In other words, when the received judgment value is the first logic value, the DOWN-side AND gate 34 does not output a DOWN pulse. When the received judgment value is the second logic value, the DOWN-side AND gate 34 transmits the pattern signal to be output as the DOWN pulse.

The charge pump circuit 24 includes a capacitor 42, a source current supply 44, a sink current supply 46, a source-side switch 48, a sink-side switch 50, and a reset switch 52. The capacitor 42 is provided between the output terminal 40 and a ground, and holds the voltage output from the output terminal 40.

The source current supply 44 outputs a preset current. The source-side switch 48 switches whether the current of the source current supply 44 charges the capacitor 42. More specifically, the source-side switch 48 charges the capacitor 42 with the current of the source current supply 44 when the UP pulse is being supplied. As a result, the source current supply 44 and the source-side switch 48 can increase the voltage of the capacitor 42 by a voltage amount corresponding to the pulse width or number of pulses of the UP pulse.

The sink current supply 46 outputs a preset current. The sink-side switch 50 switches whether the current of the sink current supply 46 is discharged from the capacitor 42. More specifically, the sink-side switch 50 discharges the current of the sink current supply 46 from the capacitor 42 when the DOWN pulse is being supplied. As a result, the sink current supply 46 and the sink-side switch 50 can decrease the voltage of the capacitor 42 by a voltage amount corresponding to the pulse width or number of pulses of the DOWN pulse.

The reset switch 52 receives the reset signal from the pattern generating section 14. The reset switch 52 connects the output terminal 40 to an initial voltage $V_{RST}$ when the reset signal is being received. The reset switch 52 can reset the capacitor 42 to the initial voltage $V_{RST}$ by connecting the output terminal 40 to the initial voltage $V_{RST}$.

The integrating section 16 having the above configuration can generate an integrated voltage corresponding to an integrated value obtained by integrating each of the pattern signals, by charging or discharging the capacitor 42 with an integral gain (current) having a sign corresponding to the judgment value. The integrating section 16 can accumulate the integrated voltage for each pattern signal using the capacitor 42. As a result, each time a pattern signal is generated, the integrating section 16 can integrate the pattern signal with an integral gain having a sign corresponding to the judgment value and output, as the reference signal, a voltage obtained by accumulating the integrated value of each pattern signal.

Figure 3:
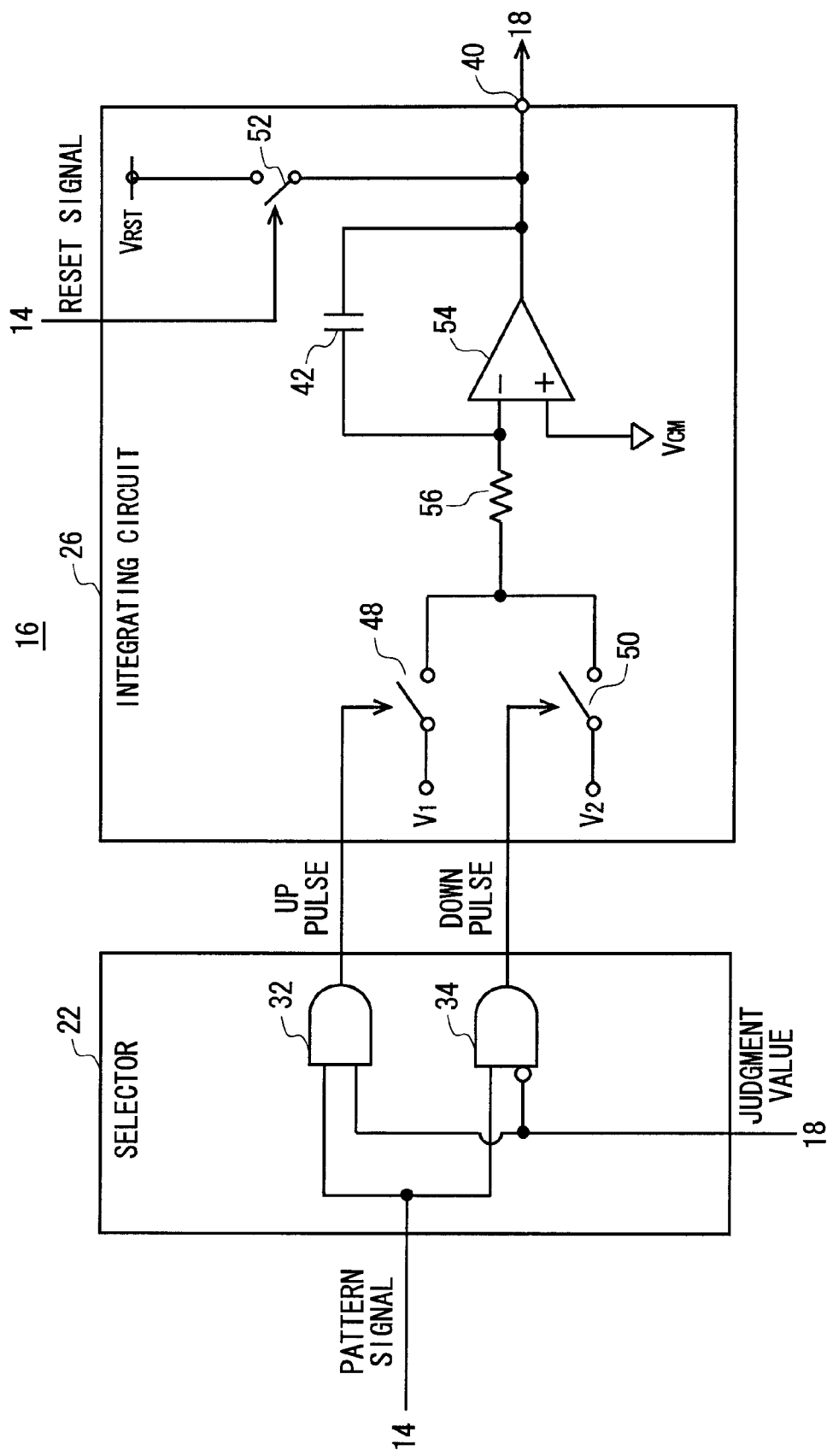
FIG. 3 shows another exemplary configuration of the integrating section 16 according to the present embodiment.

FIG. 3 shows another configuration of the integrating section 16 according to the present embodiment. The integrating section 16 may include an integrating circuit 26 instead of the charge pump circuit 24.

The integrating circuit 26 includes an operational amplifier 54, the capacitor 42, a resistor 56, the source-side switch 48, the sink-side switch 50, and a reset switch 52.

The output end of the operational amplifier 54 is connected to the output terminal 40 of the integrating circuit 26, and the non-inverted input end of the integrating circuit 26 is connected to a common voltage $V_{CM}$. The capacitor 42 is connected between the output end and inverted input end of the operational amplifier 54. The first terminal of the resistor 56 is connected to the inverted input end of the operational amplifier 54. The second terminal of the resistor 56 is connected to a source-side voltage $V_1$ or a sink-side voltage $V_2$ via the source-side switch 48 or the sink-side switch 50. The operational amplifier 54 connected in this manner can output a voltage obtained by integrating the voltage applied to the second terminal of the resistor 56.

The source-side switch 48 switches whether the source-side voltage $V_1$ is applied to the second terminal of the resistor 56, which is the terminal that is not connected to the inverted input end of the operational amplifier 54. More specifically, the source-side switch 48 applies the source-side voltage $V_1$ to the second terminal of the resistor 56 when the UP pulse is being supplied.

The sink-side switch 50 switches whether the sink-side voltage $V_2$ is applied to the second terminal of the resistor 56, which is the terminal that is not connected to the inverted input end of the operational amplifier 54. More specifically, the sink-side switch 50 applies the sink-side voltage $V_2$ to the second terminal of the resistor 56 when the DOWN pulse is being supplied.

Here, the source-side voltage $V_1$ is greater, i.e. more positive, than the common voltage $V_{CM}$. The sink-side voltage $V_2$ is less, i.e. more negative, than the common voltage $V_{CM}$. The absolute value of the difference between the source-side voltage $V_1$ and the common voltage $V_{CM}$ may be equal to the absolute value of the difference between the sink-side voltage $V_2$ and the common voltage $V_{CM}$, for example.

The reset switch 52 connects the output terminal 40 to the initial voltage $V_{RST}$ when the reset signal is being received from the pattern generating section 14. As a result, the reset switch 52 can reset the output voltage of the operational amplifier 54 to the initial voltage $V_{RST}$.

This integrating section 16 can generate an integrated voltage corresponding to an integrated value obtained as the integral of each pattern signal by integrating the integral gain (voltage) having a sign corresponding to the judgment value. The integrating section 16 having the above configuration can generate a voltage obtained by accumulating the integrated voltage for each pattern signal.

Figure 4:
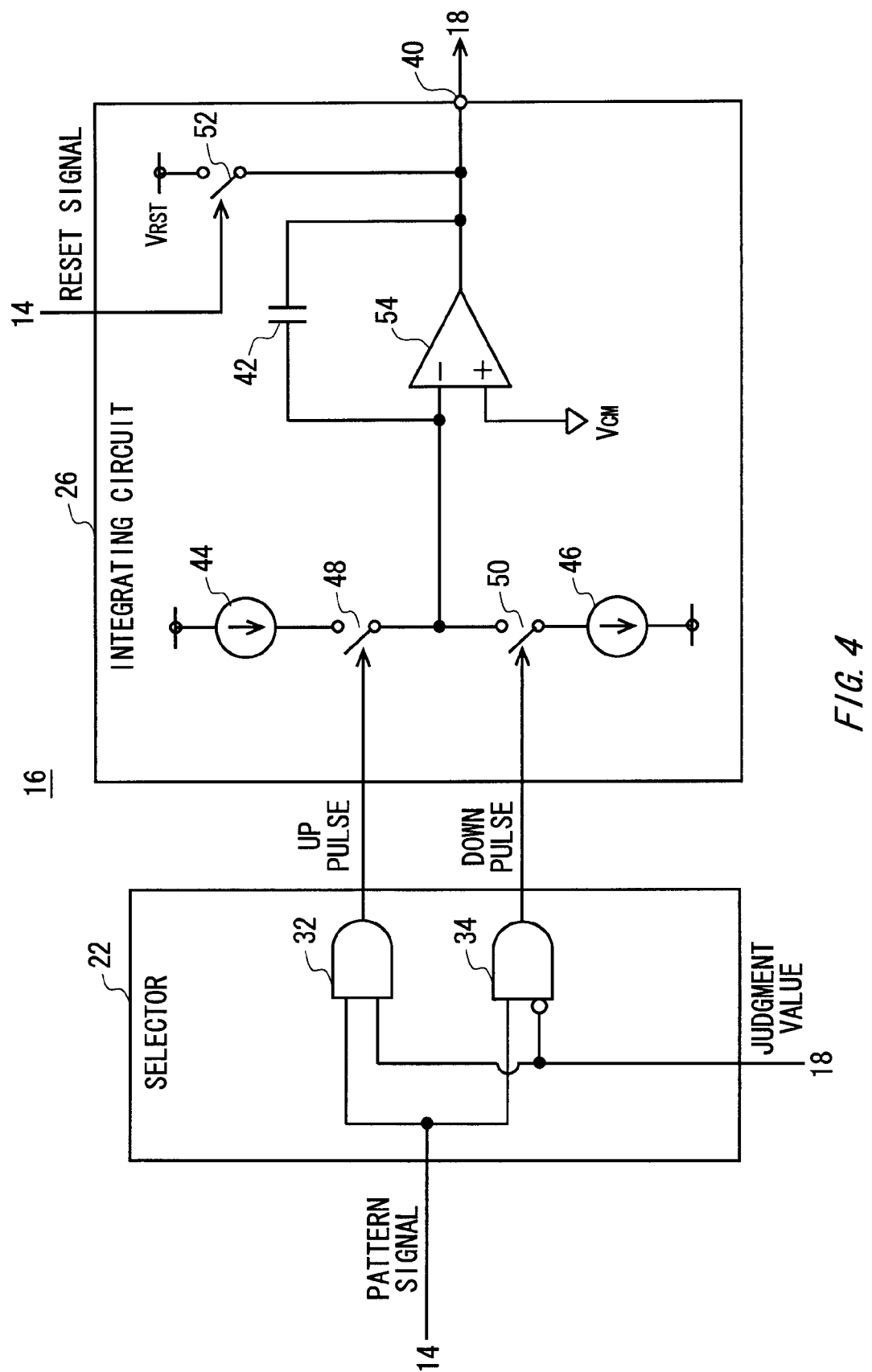
FIG. 4 shows yet another exemplary configuration of the integrating section 16 according to the present embodiment.

FIG. 4 shows yet another configuration of the integrating section 16 according to the present embodiment. The integrating section 16 of FIG. 4 has substantially the same configuration as the integrating section 16 shown in FIG. 3, and therefore components that are substantially the same are given the same reference numerals and further descriptions are omitted.

The integrating circuit 26 may have the configuration shown in FIG. 4 instead of the configuration shown in FIG. 3. In other words, the integrating circuit 26 may include the operational amplifier 54, the capacitor 42, the source current supply 44, the sink current supply 46, the source-side switch 48, the sink-side switch 50, and the reset switch 52.

The source current supply 44 outputs a preset current. The source-side switch 48 switches whether the current of the source current supply 44 is supplied to the inverted input terminal of the operational amplifier 54. More specifically, the source-side switch 48 supplies the current of the source current supply 44 to the inverted input terminal of the operational amplifier 54 when the UP pulse is being supplied. As a result, the source current supply 44 and the source-side switch 48 can supply the capacitor 42 with a charge corresponding to the pulse width or number of pulses of the UP pulse. Accordingly, the operational amplifier 54 can decrease the output voltage by a voltage amount corresponding to the pulse width or number of pulses of the UP pulse.

The sink current supply 46 outputs a preset current. The sink current supply 46 outputs a current in the opposite direction of the source current supply 44. The sink-side switch 50 switches whether the current of the sink current supply 46 is pulled from the inverted input terminal of the operational amplifier 54. More specifically, the sink-side switch 50 pulls the current of the sink current supply 46 from the inverted input terminal of the operational amplifier 54 when the DOWN pulse is being supplied. As a result, the sink current supply 46 and the sink-side switch 50 can pull from the capacitor 42 a charge corresponding to the pulse width or number of pulses of the DOWN pulse. Accordingly, the operational amplifier 54 can increase the output voltage by a voltage amount corresponding to the pulse width or number of pulses of the DOWN pulse.

This integrating section 16 can generate an integrated voltage corresponding to an integrated value obtained as the integral of each pattern signal by integrating the integral gain (current) having a sign corresponding to the judgment value. The integrating section 16 having the above configuration can generate a voltage obtained by accumulating the integrated voltage for each pattern signal.

Figure 5:
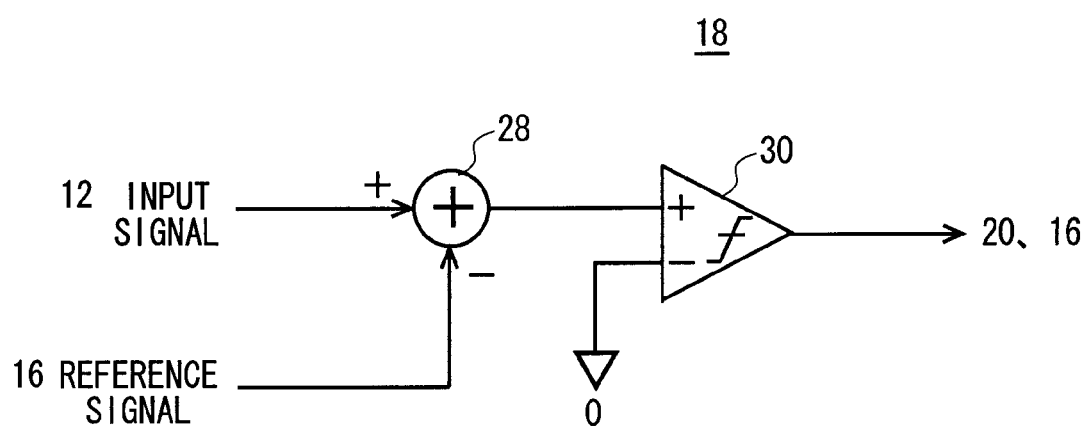
FIG. 5 shows an exemplary configuration of the comparing section 18.

FIG. 5 shows an exemplary configuration of the comparing section 18. The comparing section 18 may include a subtracting section 28 and a comparator 30.

The subtracting section 28 subtracts the reference signal output by the integrating section 16 from the input signal sampled by the sample/hold section 12. The comparator 30 compares the signal resulting from the reference signal being subtracted from the input signal to a 0-level, e.g. a ground potential.

In the present embodiment, the comparator 30 compares the signal resulting from the reference signal being subtracted from the input signal to the O-level each time generation of a pattern signal is finished. As a result, the comparing section 18 can judge whether the input signal is greater than the reference signal.

Figure 6:
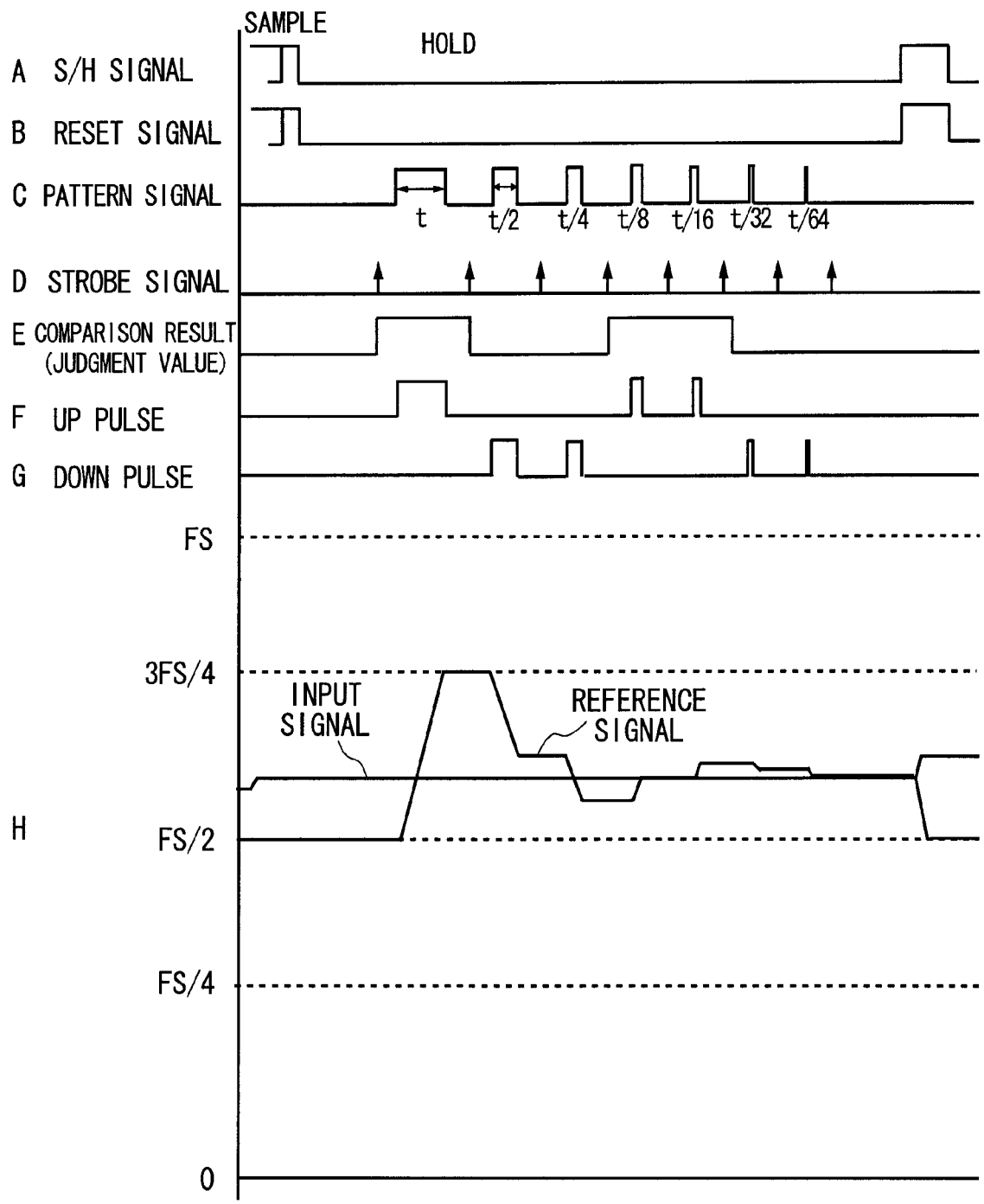
FIG. 6 shows a timing chart of each signal of the AD conversion apparatus 10 according to the present embodiment.

FIG. 6 shows a timing chart of each signal of the AD conversion apparatus 10 according to the present embodiment, when converting an 8-bit input signal into output data.

As shown by A in FIG. 6, the pattern generating section 14 supplies the sample/hold section 12 with the sample/hold signal, thereby causing the sample/hold section 12 to sample the input signal at a predetermined timing. The pattern generating section 14 may cause the sample/hold section 12 to sample the input signal at prescribed intervals, for example. After the input signal is sampled, the pattern generating section 14 causes the sample/hold section 12 to hold the sampled input signal until the next sampling of the input signal.

As shown by B in FIG. 6, the pattern generating section 14 generates the reset signal prior to generating the pattern signal. When the reset signal is received, the integrating section 16 resets the reference signal to the minimum value or the maximum value of an input signal that can be input to the AD conversion apparatus 10.

Instead, the integrating section 16 may reset the reference signal to an intermediate value that is within a range of values of an input signal that can be input to the AD conversion apparatus 10, e.g. a value that is half of the full scale. In this case, the pattern generating section 14 generates the reset signal, instead of the pattern signal generated according to the most significant bit of the output data. In other words, in this case, the pattern generating section 14 does not generate a pattern signal having a pulse width or number of pulses corresponding to the weighting of the most significant bit. FIG. 6 shows an example in which the reset signal is generated instead of the pattern signal generated in correspondence with the most significant bit.

Next, as shown by C in FIG. 6, during the holding period, the pattern generating section 14 sequentially specifies one target bit at a time, beginning from the most significant bit of the output data, and sequentially outputs pattern signals that respectively have a pulse width or number of pulses corresponding to the weighting of the specified target bits.

For example, the output data may have N bits. In this case, the pattern generating section 14 first specifies the N-th bit as the target bit, and generates a pattern signal having a pulse width (time of x) corresponding to the weighting of the N-th bit or a number of pulses ($p \times 2^{(N-1)}$ pulses) corresponding to the weighting of the N-th bit. Here, N is an integer greater than 1. Furthermore, x is any positive real number, and p is any positive integer.

Next, the pattern generating section 14 specifies the (N−1)-th bit as the target bit, and generates a pattern signal having a pulse width (time of x/2) corresponding to the weighting of the (N−1)-th bit or a number of pulses ($p \times 2^{(N-2)}$ pulses) corresponding to the weighting of the (N−1)-th bit. The pattern generating section 14 then specifies the (N−2)-th bit as the target bit, and generates a pattern signal having a pulse width (time of x/4) corresponding to the weighting of the (N−2)-th bit or a number of pulses ($p \times 2^{(N-3)}$ pulses) corresponding to the weighting of the (N−2)-th bit.

From then on, the pattern generating section 14 specifies the target bit (n-th bit) to be sequentially 1 bit lower, and for each target bit (n-th bit) generates a pattern signal having a pulse width (time of $x/2^{(N-1)}$) or a number of pulses ($p \times 2^{(n-1)}$ pulses) corresponding to the weighting of the n-th bit. Here, n is a positive integer that is no greater than N. Finally, the pattern generating section 14 generates a pattern signal having a pulse width (time of $x/2^{(N-1)}$) or a number of pulses (p pulses) corresponding to the weighting of the first bit.

In the example of FIG. 6, the pattern generating section 14 sequentially outputs, moving downward, the pattern signals that respectively have a pulse width corresponding to the weighting of each bit of the output data. In this example, the pattern generating section 14 resets the reference signal to a value that is half of the full scale using the reset signal, instead of generating a pattern signal corresponding to the most significant bit. Accordingly, the pattern generating section 14 does not output a pattern signal with a pulse width corresponding to the most significant bit.

In the example of FIG. 6, the pattern generating section 14 sequentially outputs a pattern signal with pulse width t, a pattern signal with pulse width t/2, a pattern signal with pulse width t/4, a pattern signal with pulse width t/8, a pattern signal with pulse width t/16, a pattern signal with pulse width t/32, and a pattern signal with pulse width t/64, beginning with the bit immediately below the most significant bit and moving lower one bit at a time in the output data.

When generating the pattern signals, the pattern generating section 14 leaves a prescribed interval between adjacent pattern signals. In this way, the pattern generating section 14 can switch the integral gain based on the comparison results and the comparison process of the comparing section 18.

As shown by D in FIG. 6, after each pattern signal corresponding to a target bit is output, the pattern generating section 14 outputs a strobe signal before outputting the pattern signal corresponding to the next bit. In this way, each time a pattern signal is finished being generated, the pattern generating section 14 can cause the comparing section 18 to make a comparison between the input signal held by the sample/hold section 12 and the reference signal output from the integrating section 16.

In the present embodiment, the pattern generating section 14 uses a reset signal to reset the reference signal to a value that is half of the full scale, instead of generating the pattern signal corresponding to the most significant bit. Therefore, prior to outputting the pattern signal corresponding to the second bit, which is after the output of the reset signal, the pattern generating section 14 outputs the first strobe signal.

As shown by E in FIG. 6, each time a strobe signal is received, the comparing section 18 outputs a judgment value based on the comparison result between the input signal and the reference signal. In the present example, the comparing section 18 outputs a judgment value that is the first logic value, e.g. a value of 1 or logic H, when the input signal is greater than the reference signal, and is the second logic value, e.g. a value of 0 or logic L, when the input signal is not greater than the reference signal. The comparing section 18 feeds back, to the integrating section 16, the judgment value based on the comparison result. Furthermore, the comparing section 18 supplies the comparison result to the output section 20.

As shown by F and G of FIG. 6, when the judgment value is the first logic value (a value of 1 or logic H), the selector 22 of the integrating section 16 outputs the UP pulse having a pulse width or a number of pulses that is the same as that of the pattern signal, in response to receiving the pattern signal. Furthermore, when the judgment value is the second logic value (a value of 0 or logic L), the selector 22 of the integrating section 16 outputs the DOWN pulse having a pulse width or a number of pulses that is the same as that of the pattern signal, in response to receiving the pattern signal.

As shown by H in FIG. 6, the integrating section 16 integrates the UP pulse, i.e. the pattern signal, with a positive integral gain while the UP pulse is being received, and adds the result to the level of the reference signal. Accordingly, the integrating section 16 increases the reference signal by a prescribed rate of increase while the UP signal is being received, i.e. while the pattern signal is being supplied.

The integrating section 16 integrates the DOWN pulse, i.e. the pattern signal, with a negative integral gain while the DOWN pulse is being received, and adds the result to the level of the reference signal. Accordingly, the integrating section 16 decreases the reference signal by a prescribed rate of decrease while the DOWN signal is being received, i.e. while the pattern signal is being supplied.

Accordingly, the integrating section 16 can change the reference signal by levels corresponding respectively to each of the bits of the output data, beginning with the most significant bit and moving downward. In other words, the integrating section 16 can change the reference signal in an order of levels that are ½, ¼, ⅛, 1/16, etc. of the range of the input signal.

The integrating section 16 can switch the sign, i.e. the direction, of the change of the reference signal according to the comparison results between the input signal and the reference signal. In other words, the integrating section 16 can increase the reference signal when the input signal is greater than the reference signal and decrease the reference signal when the input signal is not greater than the reference signal.

As a result of the above, the integrating section 16 can sequentially change the direction such that the reference signal draws closer to the input signal. More specifically, the integrating section 16 can change the reference signal to be the same as a signal output from a DA converter provided in a successive approximation AD conversion apparatus. In other words, the integrating section 16 can output a reference signal whose level changes according to a binary search. Accordingly, the AD conversion apparatus 10 can output data indicating the level of the input signal by outputting output data in which the value of each bit is the corresponding comparison result obtained after the integration of the pattern signal corresponding to the bit.

The AD conversion apparatus 10 of the present embodiment can obtain a fixed waveform for the pattern signal output from the pattern generating section 14, regardless of the level of the input signal or the like. In other words, the AD conversion apparatus 10 can perform an AD conversion without feeding back, to the pattern generating section 14, the comparison results between the input signal and the reference signal. As a result, the AD conversion apparatus 10 can perform AD conversions with a simple configuration, and with very little digital processing.

Figure 7:
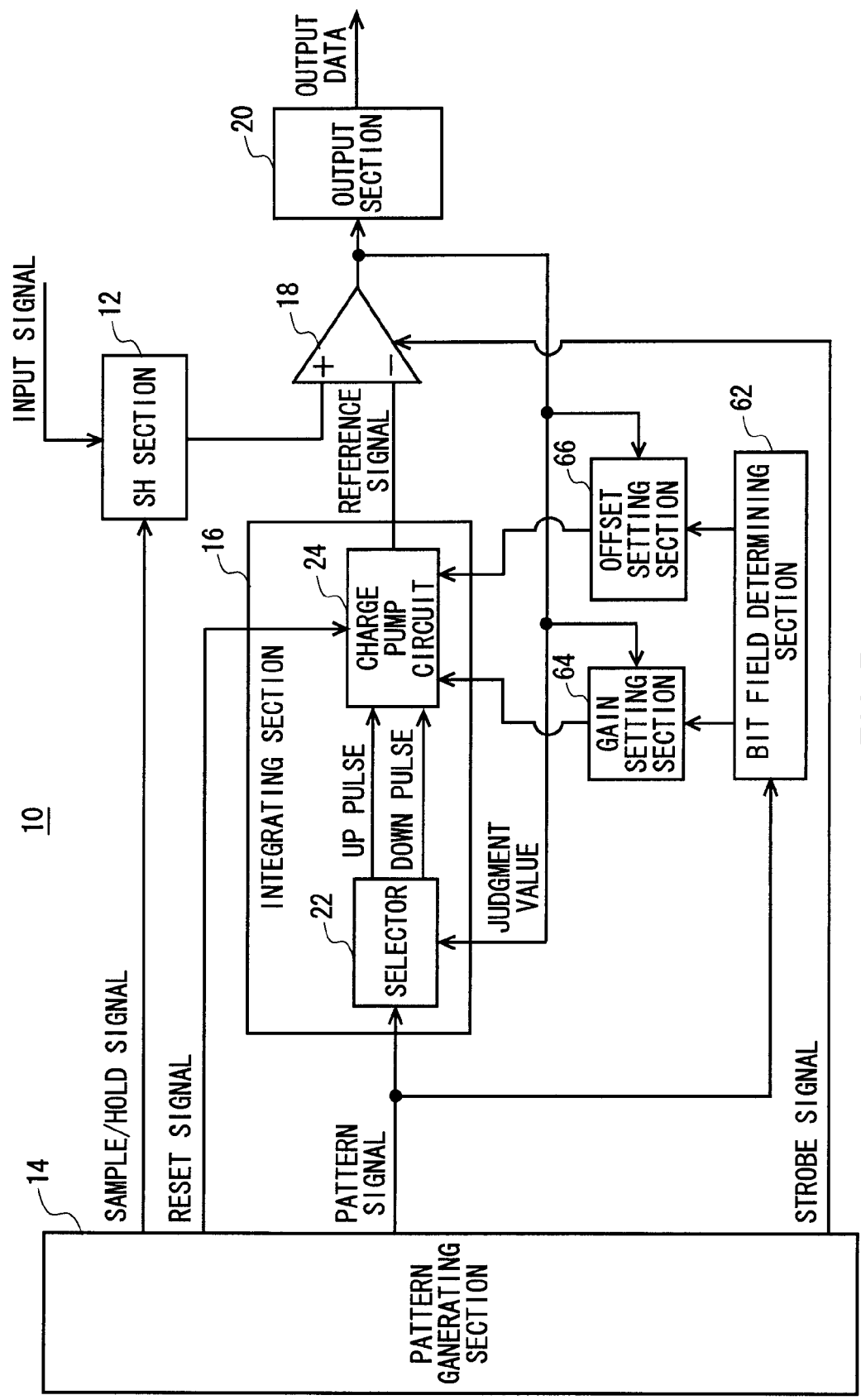
FIG. 7 shows an exemplary configuration of the AD conversion apparatus 10 according to a first modification of the present embodiment.

FIG. 7 shows an exemplary configuration of the AD conversion apparatus 10 according to a first modification of the present embodiment. The AD conversion apparatus 10 of the present modification has substantially the same function and configuration as the AD conversion apparatus 10 shown in FIG. 1, and therefore components having the same function and configuration as those shown in FIG. 1 are given the same reference numerals and the following description includes only differing points.

The AD conversion apparatus 10 of the present modification further includes a bit field determining section 62, a gain setting section 64, and an offset setting section 66. The bit field determining section 62 determines which bit field in the output data a pattern signal to be supplied to the integrating section 16 corresponds to, prior to the pattern signal being supplied. The bit field determining section 62 supplies the gain setting section 64 and the offset setting section 66 with the determination result.

The gain setting section 64 sets the integral gain in the integrating section 16. Prior to the integration of each pattern signal, the gain setting section 64 changes the integral gain in the integrating section 16 according to the bit field of the bit corresponding to the pattern signal. For example, for each pattern signal, the gain setting section 64 may change the current amount of the source current supply 44 and the sink current supply 46 within the charge pump circuit 24.

Furthermore, prior to each pattern signal being integrated, the gain setting section 64 may change the integral gain in the integrating section 16 according to the judgment value for judging the value of the bit corresponding to the pattern signal. In other words, the gain setting section 64 may change the integral gain according to whether the reference signal is to be increased or decreased. In this case, the gain setting section 64 may individually change the current amount of the source current supply 44 and the current amount of the sink current supply 46 within the charge pump circuit 24.

The offset setting section 66 sets an offset in the integrating section 16. Prior to the integration of each pattern signal, the offset setting section 66 changes the offset in the integrating section 16 according to the bit field of the bit corresponding to the pattern signal. For example, for each pattern signal, the offset setting section 66 may change the offset of the current that charges the capacitor 42 or is discharged from the capacitor 42 in the charge pump circuit 24.

Furthermore, prior to the integration of each pattern signal, the offset setting section 66 may change the offset in the integrating section 16 according to the judgment value for judging the value of the target bit corresponding to the pattern signal. In other words, the offset setting section 66 may change the offset in the integrating section 16 according to whether the reference signal is to be increased or decreased. For example, the offset setting section 66 may individually change the offset of the current when charging the capacitor 42 in the charge pump circuit 24 and the offset of the current when discharging from the capacitor 42.

The gain setting section 64 and the offset setting section 66 store in advance, for each bit field, the integral gain and the offset to be set. For example, the gain setting section 64 and the offset setting section 66 may store an integral gain and an offset that are measured in advance during a calibration.

The AD conversion apparatus 10 of the present modification can adjust the amount by which the reference signal is increased or decreased by changing the integral gain and the offset for each pattern signal and each integral sign. As a result, the AD conversion apparatus 10 can perform an AD conversion with good linearity.

Figure 8:
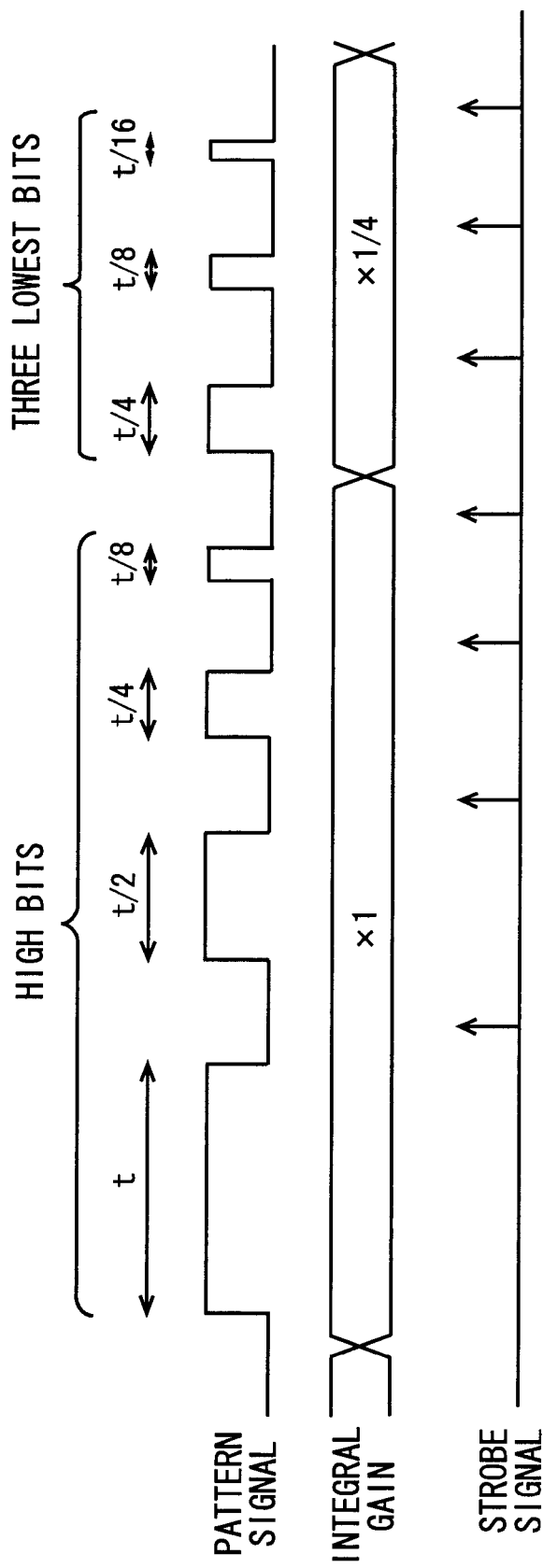
FIG. 8 shows a timing chart of each signal of the AD conversion apparatus 10 according to the first modification.

FIG. 8 shows a timing chart for each signal of the AD conversion apparatus 10 according to the first modification. The pattern generating section 14 may change the ratio of the pulse width (or number of pulses) to the weighting of the bits, for each bit field of the output data.

In the example of FIG. 8, the pattern generating section 14 causes the ratio of the pulse width to the bit weighting to be greater for each pattern signal corresponding to the three lowest bits in the output data than for the pattern signals corresponding to the higher bits in the output data. More specifically, the pattern generating section 14 causes the ratio of the pulse width to the bit weighting to be four times greater for each pattern signal corresponding to the three lowest bits in the output data than for the pattern signals corresponding to the higher bits in the output data.

In this case, the gain setting section 64 changes the integral gain in the integrating section 16 such that the product of the pulse width (or number of pulses) and integral gain is proportional to the bit weighting. In the example of FIG. 8, the gain setting section 64 causes the integral gain used when integrating the pattern signals corresponding to the lowest three bits of the output data to be ¼ of the integral gain used when integrating the pattern signals corresponding to the higher bits of the output data. As a result, by integrating the pattern signals, the gain setting section 64 can increase or decrease the reference signal in proportion to a weighting corresponding to each bit.

Therefore, the AD conversion apparatus 10 of the present modification need not generate pattern signals that are extremely long, or that have an extremely large number of pulses, even when there is an extremely large difference in weighting between the most significant bit and the least significant bit, and can therefore shorten the conversion time. Furthermore, the AD conversion apparatus 10 need not generate pattern signals that are extremely short, or that have an extremely small number of pulses, and can therefore perform the AD conversion with high accuracy.

Figure 9:
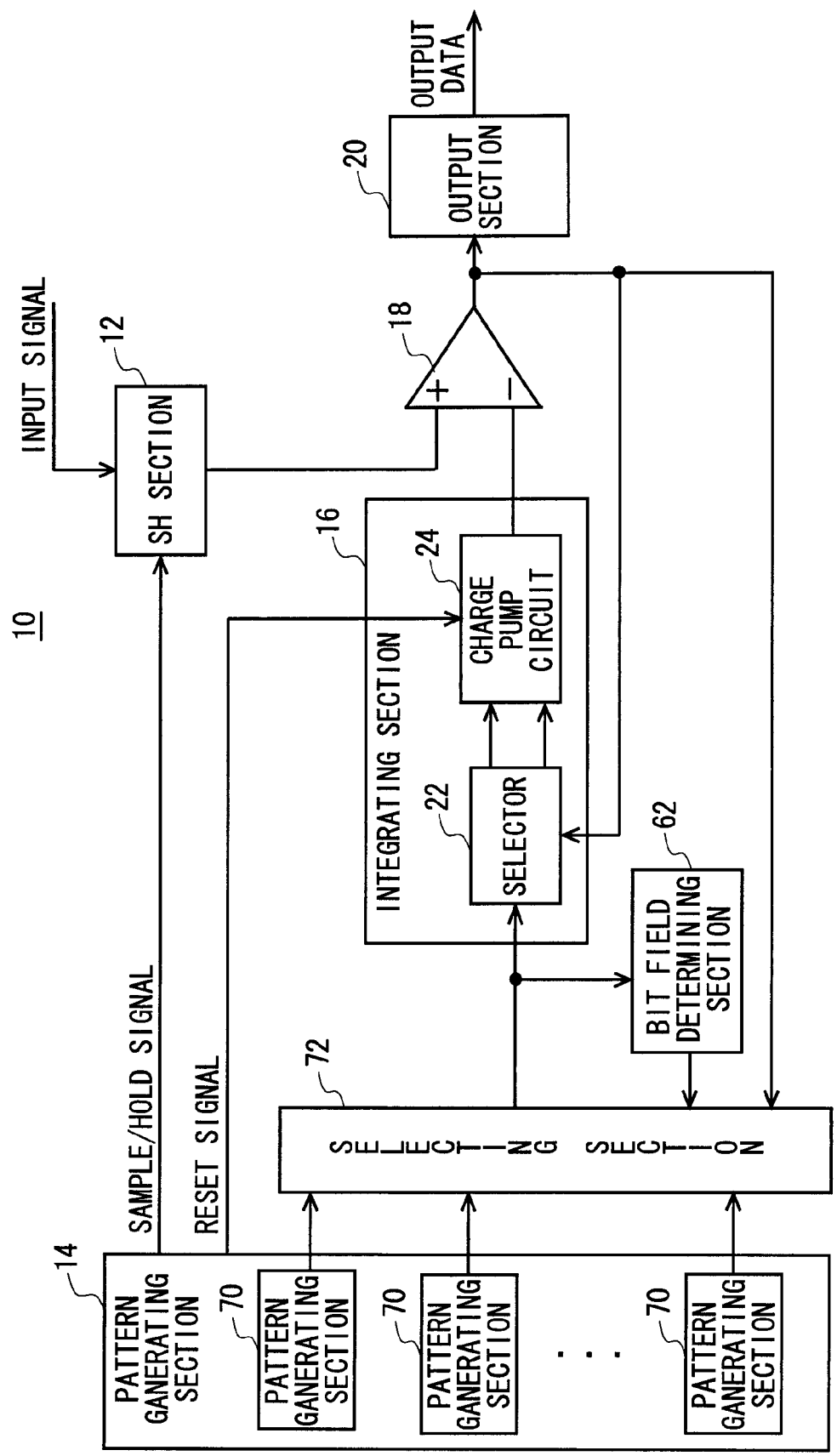
FIG. 9 shows an exemplary configuration of the AD conversion apparatus 10 according to a second modification of the present embodiment.

FIG. 9 shows a configuration of the AD conversion apparatus 10 according to a second modification of the present embodiment. The AD conversion apparatus 10 of the present modification has substantially the same function and configuration as the AD conversion apparatus 10 shown in FIG. 1, and therefore components having the same function and configuration as those shown in FIG. 1 are given the same reference numerals and the following description includes only differing points.

In the present modification, the pattern generating section 14 includes a plurality of pattern generators 70. Each pattern generator 70 generates a pattern signal with a different pulse width or different number of pulses for each bit field of the output data.

The AD conversion apparatus 10 of the present embodiment further includes a bit field determining section 62 and a selecting section 72. The bit field determining section 62 determines which bit field of the output data a pattern signal to be supplied to the integrating section 16 corresponds to, prior to the pattern signal being supplied. The bit field determining section 62 supplies the determination result to the selecting section 72.

Prior to the generation of the pattern signals in each bit field, the selecting section 72 selects the pattern signal generated by one of the pattern generators 70 from among the plurality of pattern generators 70. The selecting section 72 supplies the selected pattern signal to the integrating section 16.

Figure 10:
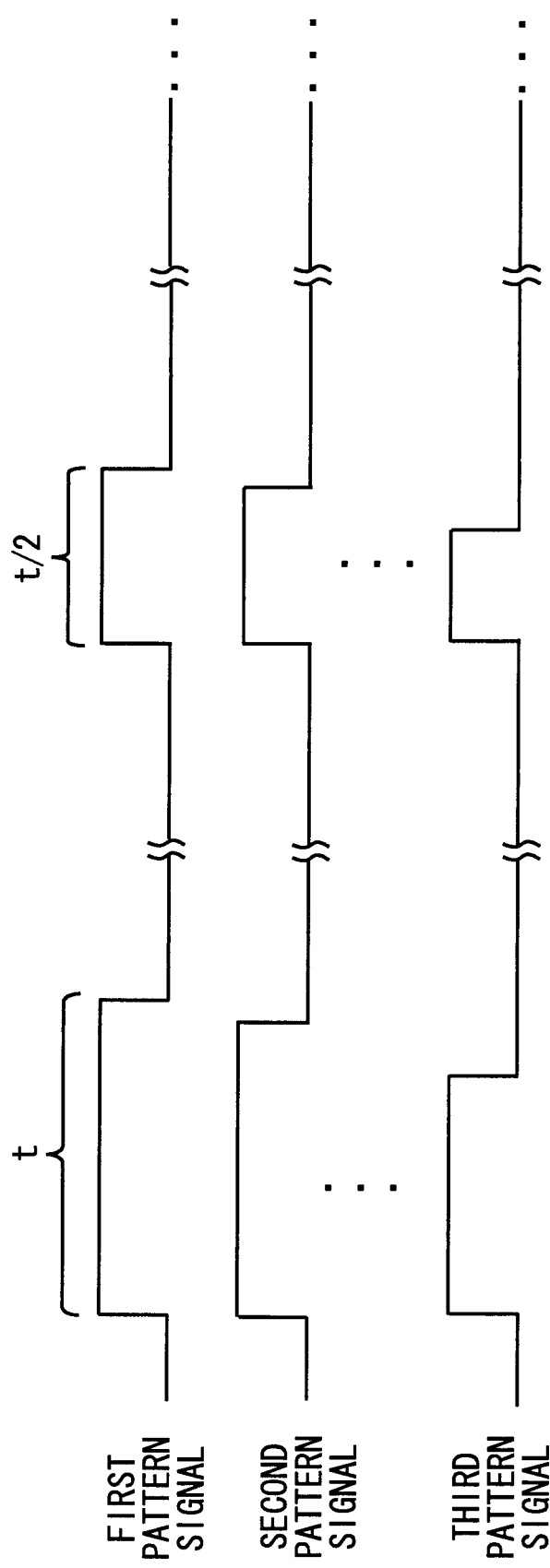
FIG. 10 shows a timing chart for each of a plurality of pattern signals in the AD conversion apparatus 10 according to the second modification.

FIG. 10 shows a timing chart for each of a plurality of pattern signals in the AD conversion apparatus 10 according to the second modification. Each pattern generator 70 generates a pattern signal having a different pulse width or different number of pulses for each pattern signal representing the same weighting. For example, as shown in FIG. 10, the pattern generators 70 may output pattern signals having pulse widths that are each slightly different, as the pattern signals indicating the weighting corresponding to the most significant bit.

The selecting section 72 stores in advance, for each bit field, a pattern signal to be selected from among the plurality of pattern signals. For example, the selecting section 72 may determine the pattern signal to be detected for each bit field using the calibration. Prior to the generation of the pattern signals corresponding to each bit field, the selecting section 72 selects one pattern signal from among the plurality of pattern signals.

The AD conversion apparatus 10 of the present modification can adjust the amount by which the reference signal increases and decreases by changing the pulse width or the number of pulses of a pattern signal for each bit field. Therefore, the AD conversion apparatus 10 can perform an AD conversion with good linearity.

Figure 11:
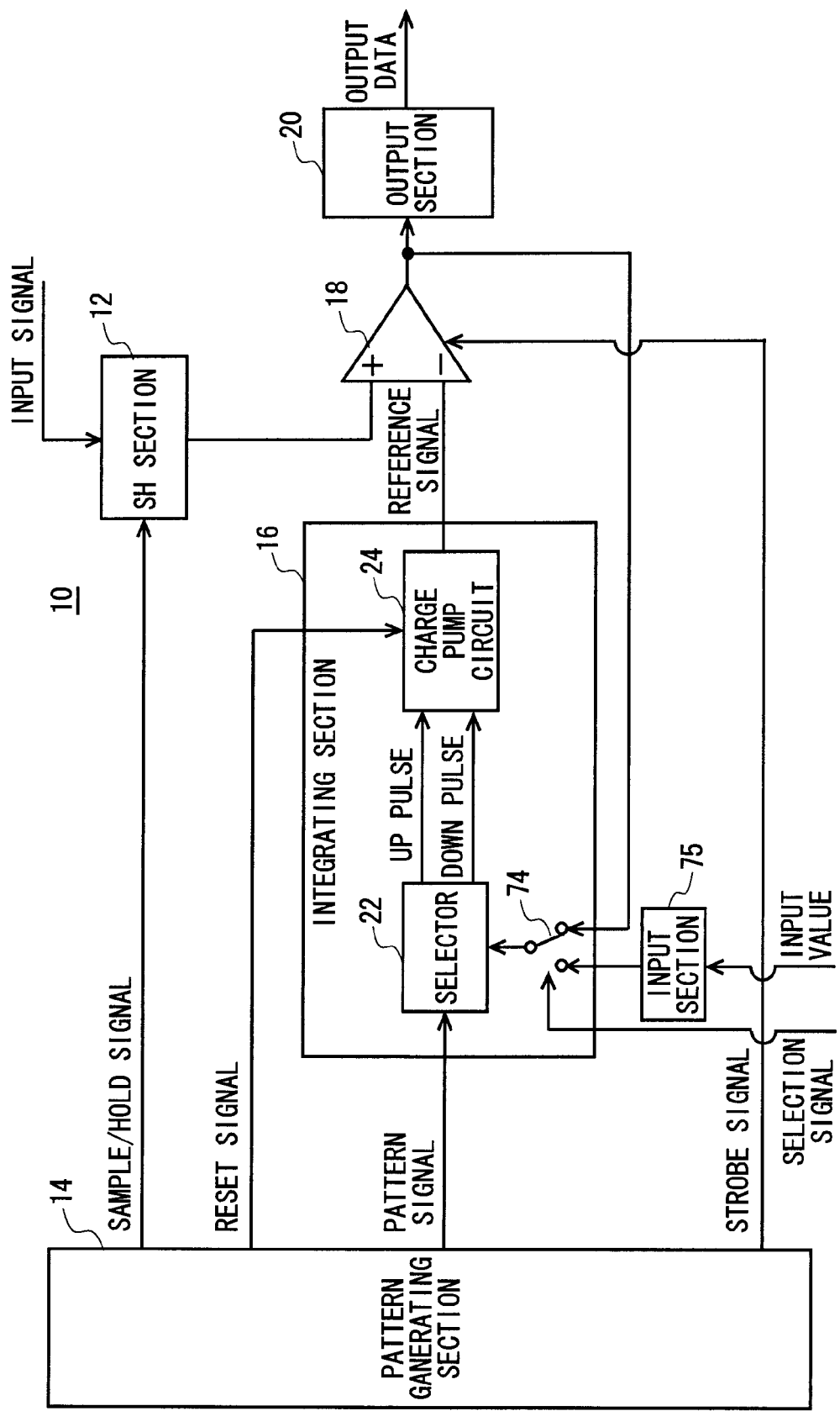
FIG. 11 shows an exemplary configuration of the AD conversion apparatus 10 according to a third modification of the present embodiment.

FIG. 11 shows a configuration of the AD conversion apparatus 10 according to a third modification of the present embodiment. The AD conversion apparatus 10 of the present modification has substantially the same function and configuration as the AD conversion apparatus 10 shown in FIG. 1, and therefore components having the same function and configuration as those shown in FIG. 1 are given the same reference numerals and the following description includes only differing points.

The integrating section 16 of the present modification includes a switch 74. The switch 74 switches whether integration is performed on a pattern signal corresponding to the judgment value or on a pattern signal corresponding to input data received from the outside, according to a selection signal received from the outside. The integrating section 16 of the present modification further includes an input section 75 that acquires input data input from the outside.

When input data is received from the outside in place of the judgment value, the pattern generating section 14 and the integrating section 16 function as a DA converter that converts the digital input data into an analog output signal. In this case, the pattern generating section 14 generates a pattern signal having a pulse width or number of pulses corresponding to the target bit, for the bits in the input data that are specified as target bits one at a time. The input section 75 selects each bit of the input data one at a time beginning with the most significant bit, and supplies the integrating section 16 with each selected bit prior to the generation of the pattern signal corresponding to the selected bit.

The integrating section 16 integrates each pattern signal with an integral gain having a sign corresponding to the value of the corresponding target bit in the input data. The integrating section 16 outputs, as the output signal, a signal obtained by accumulating the integrated value of each pattern signal from the most significant bit to the least significant bit of the input data. In this way, the pattern generating section 14 and the integrating section 16 function as a DA conversion apparatus.

Furthermore, the integrating section 16 of the present modification may perform a calibration prior to the AD conversion process. During the calibration, the integrating section 16 and the pattern generating section 14 may function as a DA conversion apparatus and output an output signal corresponding to the input data.

The integrating section 16 adjusts the integral gain and the offset thereof, as well as the pulse width or number of pulses of the pattern signal, such that the output signal corresponding to each piece of input data is at the target level. In this way, the AD conversion apparatus 10 of the present modification can perform an AD conversion with good linearity.

Figure 12:
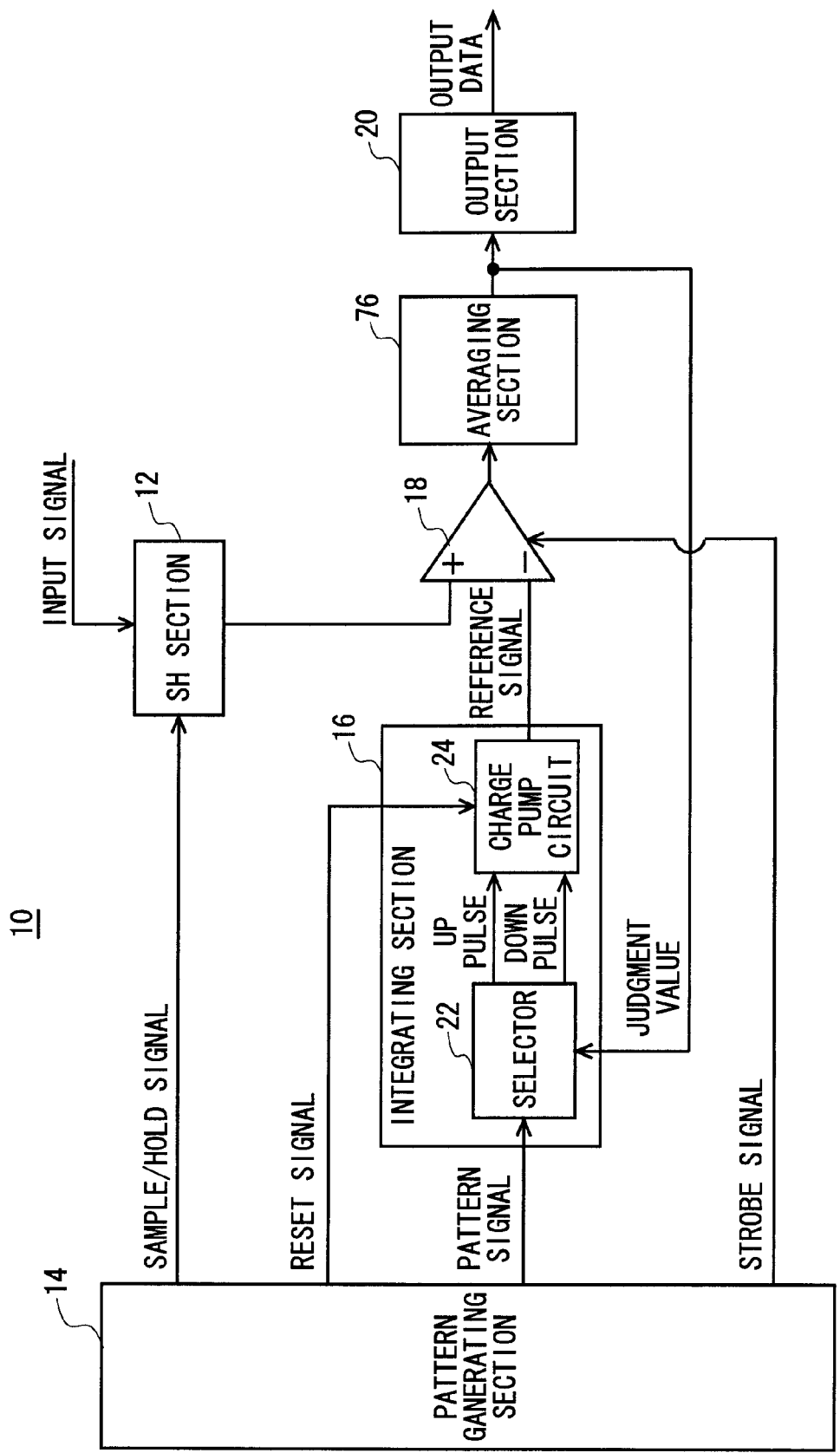
FIG. 12 shows an exemplary configuration of the AD conversion apparatus 10 according to a fourth modification of the present embodiment.

FIG. 12 shows a configuration of the AD conversion apparatus 10 according to a fourth modification of the present embodiment. The AD conversion apparatus 10 of the present modification has substantially the same function and configuration as the AD conversion apparatus 10 shown in FIG. 1, and therefore components having the same function and configuration as those shown in FIG. 1 are given the same reference numerals and the following description includes only differing points.

The AD conversion apparatus 10 of the present modification further includes an averaging section 76. In the present modification, after each pattern signal is generated but before the next pattern signal is generated, the pattern generating section 14 generates the strobe signal a plurality of times. As a result, after each pattern signal is generated, the comparing section 18 compares the input signal to the reference signal a plurality of times.

Each time the generation of a pattern signal is completed, the averaging section 76 averages the plurality of comparison results output from the comparing section 18. For example, the averaging section 76 may output, as the average of the plurality of comparison results, a majority result among the plurality of comparison results.

The output section 20 determines the value of the target bit and the bit judgment value for judging the next target bit based on the average of the plurality of comparison results. The AD conversion apparatus 10 of the modification can perform an AD conversion with high accuracy.

Figure 13:
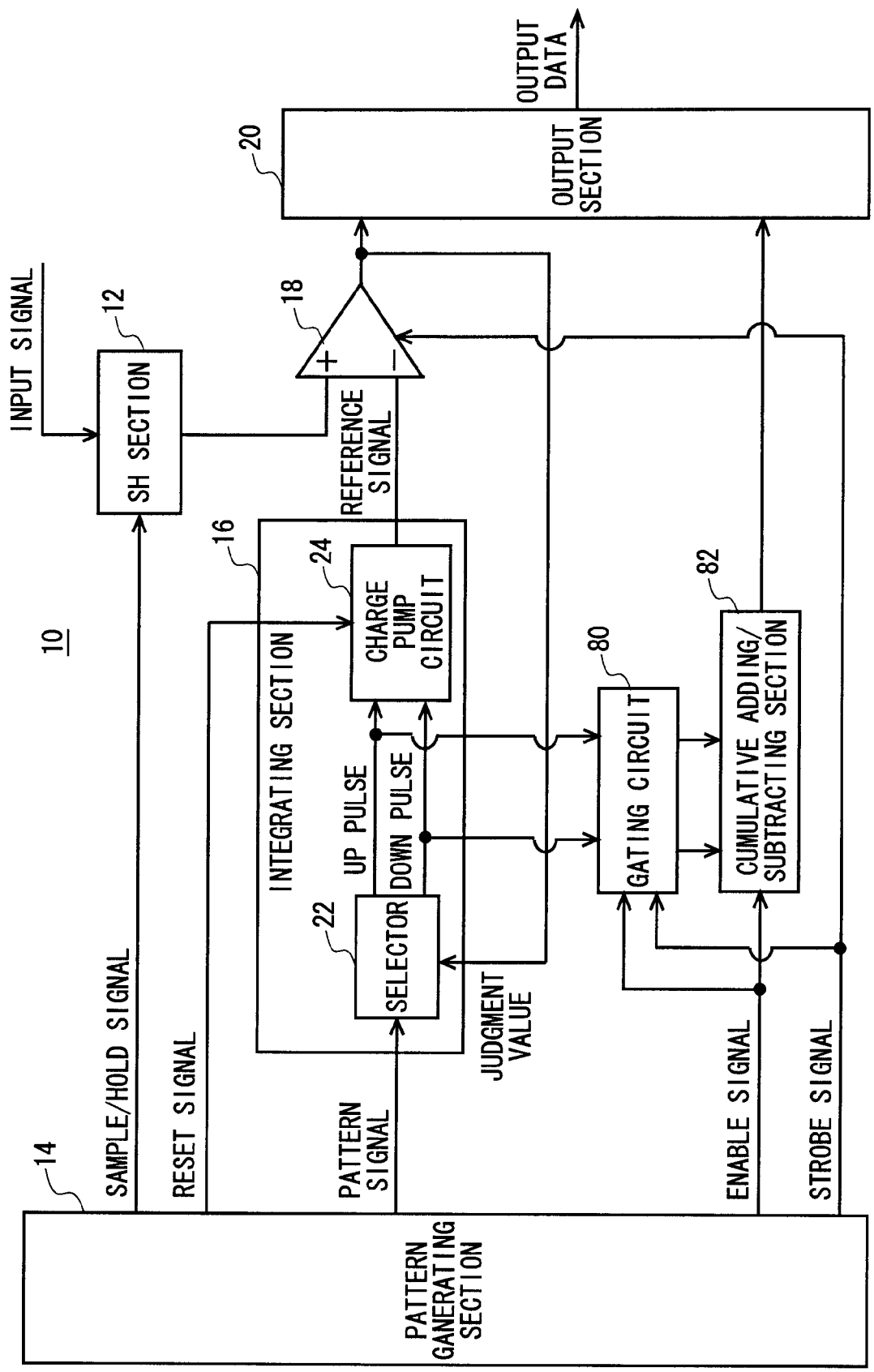
FIG. 13 shows an exemplary configuration of the AD conversion apparatus 10 according to a fifth modification of the present embodiment.

FIG. 13 shows a configuration of the AD conversion apparatus 10 according to a fifth modification of the present embodiment. The AD conversion apparatus 10 of the present modification has substantially the same function and configuration as the AD conversion apparatus 10 shown in FIG. 1, and therefore components having the same function and configuration as those shown in FIG. 1 are given the same reference numerals and the following description includes only differing points.

In the present modification, the pattern generating section 14 further includes a gating circuit 80 and a cumulative adding/subtracting section 82. In the present modification, for each target bit specified while moving downward one at a time in a high bit field that spans from the most significant bit to a predetermined bit, the pattern generating section 14 generates a pattern signal having a pulse width or number of pulses corresponding to the target bit. In other words, the pattern generating section 14 generates the same pattern signal as the pattern generating section 14 of FIG. 1 for each bit in the high bit field.

Then, the pattern generating section 14 repeatedly generates pattern signals that each have a pulse width or number of pulses corresponding to the weighting of the least significant bit. For example, the pattern generating section 14 may repeatedly generate a prescribed number of pattern signals, e.g. a number of pattern signals equal to the maximum value of the data indicated by a low bit field.

As a more specific example, when the low bit field has a 4-bit width, the pattern generating section 14 may generate 16 pattern signals. Furthermore, the pattern generating section 14 generates an enable signal while repeatedly generating the pattern signals that each have a pulse width or number of pulses corresponding to the weighting of the least significant bit.

The gating circuit 80 acquires the UP pulses and the DOWN pulses, which are signals indicating whether the reference signal is increased or decreased at the timing of the strobe signal, during the period in which the enable signal is output, i.e. during the period in which the pattern signals that each have a pulse width or number of pulses corresponding to the weighting of the least significant bit are being repeatedly generated. The gating circuit 80 transmits the acquired UP pulses and DOWN pulses to the cumulative adding/subtracting section 82.

The pattern generating section 14 may generate each pattern signal in synchronization with the timing of a reference clock. In this case, the gating circuit 80 may acquire the UP pulses and the DOWN pulses at the timing of the reference clock, instead of at the timing of the strobe signal.

Each time the generation of a pattern signal having a pulse width or number of pulses corresponding to the weighting of the least significant bit is completed, the cumulative adding/subtracting section 82 increments or decrements a counter value by 1 according to the comparison result between the input signal and the reference signal. For example, the cumulative adding/subtracting section 82 may increment and decrement the counter value during a period from when the generation of the generation of the pattern signals having a pulse width or number of pulses corresponding to the weighting of the least significant bit begins to when a predetermined number of pattern signals have been generated.

When the output judgment result indicates that the input signal is greater than the reference signal, the cumulative adding/subtracting section 82 may increment the counter value by 1. When the output judgment result indicates that the input signal is not greater than the reference signal, the cumulative adding/subtracting section 82 may decrement the counter value by 1. In the present embodiment, the cumulative adding/subtracting section 82 increments the counter value by 1 when an UP pulse is received via the gating circuit 80. Furthermore, the cumulative adding/subtracting section 82 decrements the counter value by 1 when a DOWN pulse is received via the gating circuit 80.

After the predetermined number of pattern signals having a pulse width or number of pulses corresponding to the weighting of the least significant bit have been generated by the pattern generating section 14, the output section 20 acquires the counter value from the cumulative adding/subtracting section 82. The output section 20 outputs data in which the value of each bit in the high bit field is a value corresponding to the comparison result output after the pattern signal having a pulse width or number of pulses corresponding to the weighting of the bit has been generated, and the value of each bit in the low bit field is a value corresponding to the counter value.

Figure 14:
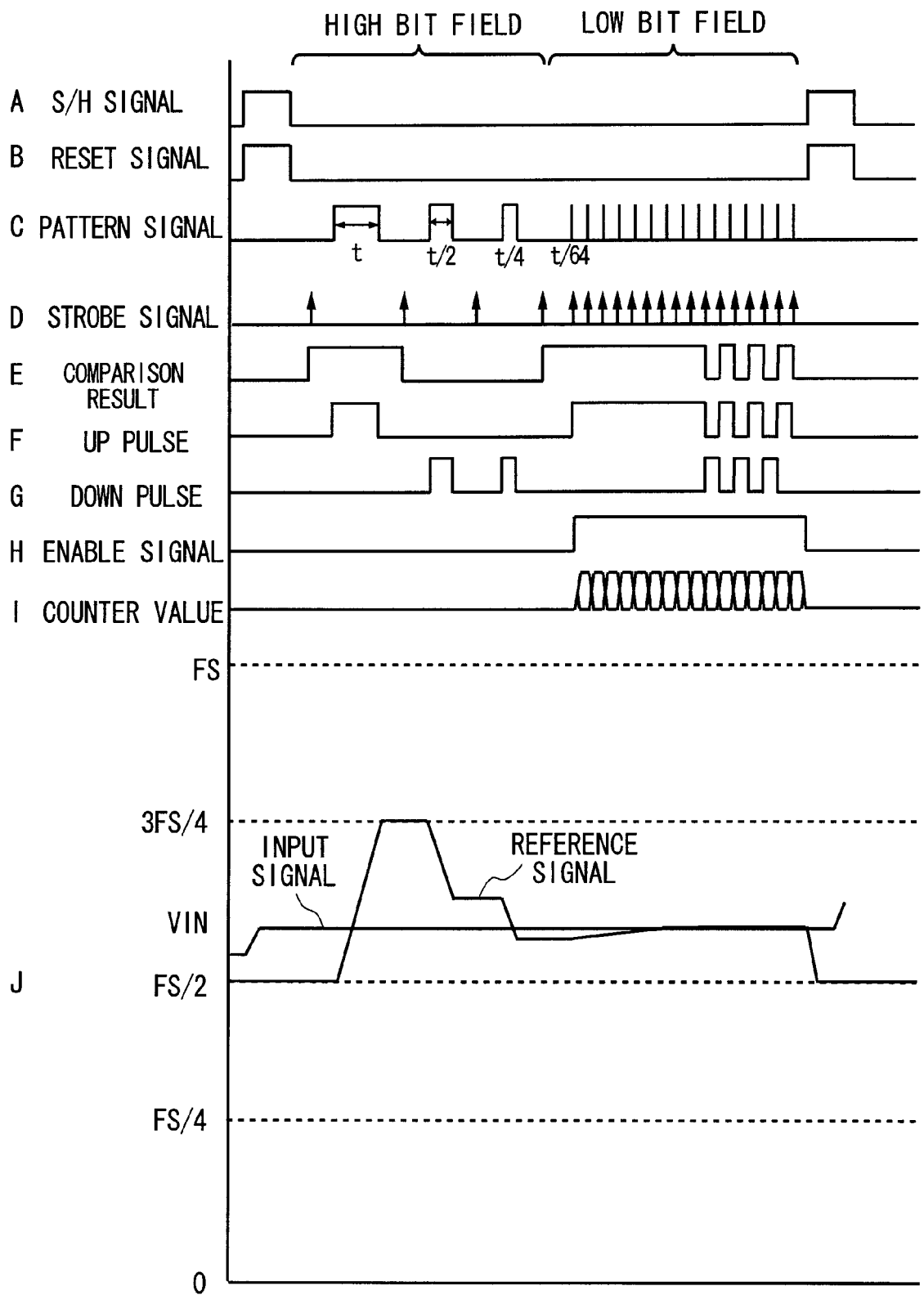
FIG. 14 shows a timing chart of each signal of the AD conversion apparatus 10 according to the fifth modification.

FIG. 14 shows a timing chart of each signal of the AD conversion apparatus 10 according to the fifth modification, when converting an input signal into 8-bit output data.

As shown by C in FIG. 14, during the hold period, the pattern generating section 14 generates a pattern signal having a pulse width or number of pulses corresponding to the weighting of the target bit for each target bit specified one at a time beginning with the highest bit in the high bit field and moving downward. Next, the pattern generating section 14 repeatedly generates a predetermined number of pattern signals having a pulse width or number of pulses corresponding to the weighting of the least significant bit.

In the example of FIG. 14, the pattern generating section 14 sequentially outputs pattern signals respectively having a pulse width corresponding to the weighting of the bits from the most significant bit to the fifth bit. In the example of FIG. 14, instead of generating a pattern signal corresponding to the most significant bit, the reset signal is used to reset the reference signal to half of the full scale. Accordingly, the pattern generating section 14 does not output a pattern signal having a pulse width corresponding to the weighting of the most significant bit, and instead begins with the bit that is one bit lower than the most significant bit of the output data to sequentially output a pattern signal with a pulse width of t, a pattern signal with a pulse width of t/2, and a pattern signal with a pulse width of t/4.

Next, after the pattern signals having a pulse width corresponding respectively to the weighting of each bit from the most significant bit to the fifth bit have been output, the pattern generating section 14 outputs 16 pattern signals that each have a pulse width of t/64.

As shown by D in FIG. 14, after each pattern signal is output and before the next pattern signal is output, the pattern generating section 14 outputs a strobe signal. As a result, the pattern generating section 14 can cause the comparing section 18 to make a comparison between the input signal and the reference signal each time generation of a pattern signal is finished.

As shown by H in FIG. 14, the pattern generating section 14 generates the enable signal while repeatedly generating the pattern signals that each have a pulse width or number of pulses corresponding to the weighting of the least significant bit. As a result, as shown by I of FIG. 14, the cumulative adding/subtracting section 82 can increment or decrement the counter value by 1 in response to the generation of an UP pulse or a DOWN pulse while the enable signal is being generated.

The counter value of the cumulative adding/subtracting section 82 may be the same as the bit-width of the low bit field of the output data. In the example of FIG. 14, the counter value is represented with four bits. The cumulative adding/subtracting section 82 may set the counter value to 0 or to a maximum value, for example, when the incrementing or decrementing begins.

Furthermore, the cumulative adding/subtracting section 82 increases and decreases the counter value in a cycling manner. In other words, the cumulative adding/subtracting section 82 returns the counter value to 0 when the maximum counter value is exceeded due to being incremented by 1. Similarly, the cumulative adding/subtracting section 82 returns the counter value to the maximum value when the counter value drops below 0 due to being decremented by 1.

As shown by J in FIG. 14, the integrating section 16 changes the reference signal by a level according to the weighting of each bit of the output data, in order beginning with the most significant bit of the output data, while the pattern generating section 14 is generating the pattern signals having a pulse width or number of pulses corresponding to the weighting of each target bit. In other words, the integrating section 16 changes the level of the reference signal by ½, ¼, ⅛, and 1/16 of the range of the input signal, in the stated order.

Next, the integrating section 16 increases or decreases the ramp wave in a direction that causes the reference signal to draw near the input signal. In this case, the integrating section 16 sequentially changes the reference signal by levels corresponding to the weighting of the least significant bit. When the difference between the reference signal and the input signal is within the range of the weighting of the least significant bit, the integrating section 16 changes the reference signal by alternately increasing and decreasing the reference signal one bit at a time.

The output section 20 acquires, from the cumulative adding/subtracting section 82, the counter value at the point in time when the difference between the input signal and the reference signal became within the range of the weighting of the least significant bit. The output section 20 outputs output data in which the value of each bit in the high bit field is a value corresponding to the comparison result obtained when the generation of the pattern signal having a pulse width or number of pulses corresponding to the weighting of the target bit is finished, and in which the value of the low bit field is a value corresponding to the counter value.

In this way, the AD conversion apparatus 10 of the present modification can determine the low bit field of the output data by changing the reference signal in a ramping manner, and can therefore perform an AD conversion with high accuracy.

Figure 15:
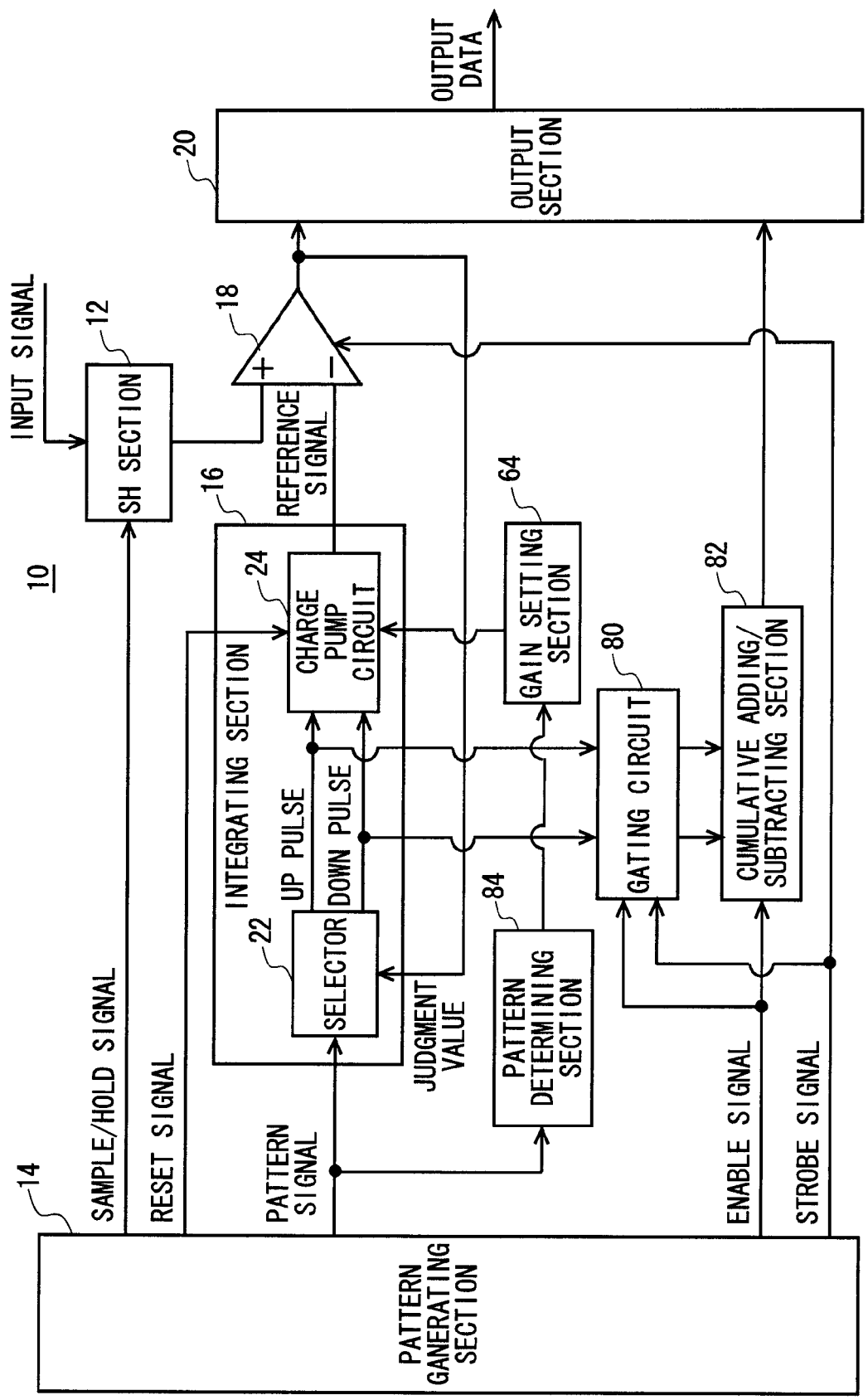
FIG. 15 shows an exemplary configuration of the AD conversion apparatus 10 according to a sixth modification of the present embodiment.

FIG. 15 shows a configuration of the AD conversion apparatus 10 according to a sixth modification of the present embodiment. The AD conversion apparatus 10 of the present modification has substantially the same function and configuration as the AD conversion apparatus 10 shown in FIG. 13, and therefore components having the same function and configuration as those shown in FIG. 13 are given the same reference numerals and the following description includes only differing points.

The AD conversion apparatus 10 of the present modification further includes a pattern determining section 84 and a gain setting section 64. The pattern determining section 84 determines whether the pattern signal supplied to the integrating section 16 has a pulse width or number of pulses corresponding to the weighting of the least significant bit. The pattern determining section 84 supplies the gain setting section 64 with the determination result. The gain setting section 64 changes the integral gain of the integrating section 16 according to whether the pattern signal has a pulse width or number of pulses corresponding to the weighting of the least significant bit.

Figure 16:
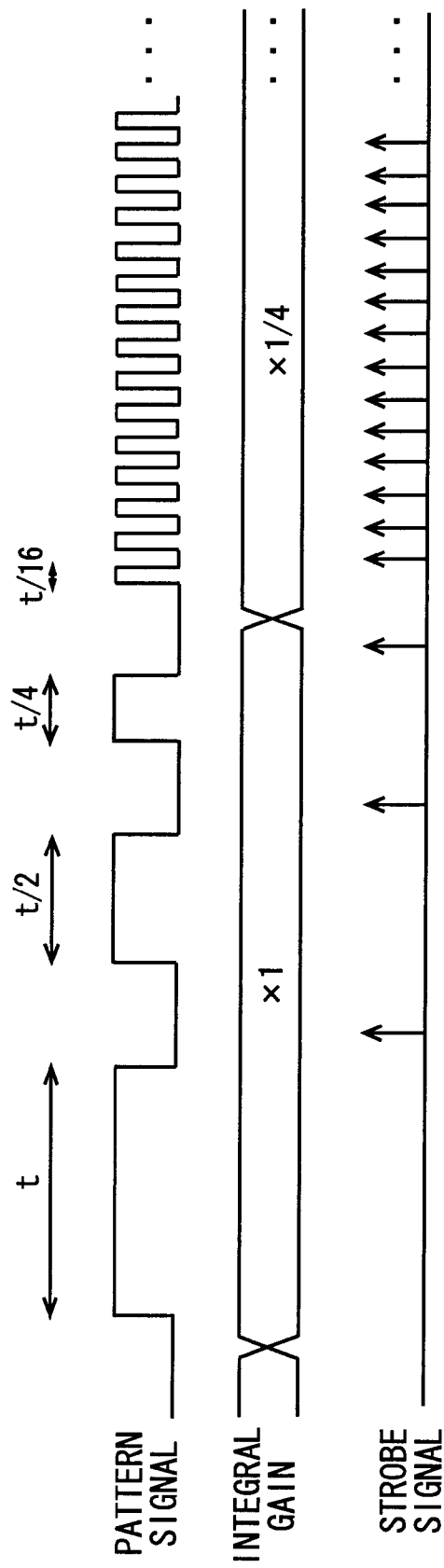
FIG. 16 shows a timing chart of each signal of the AD conversion apparatus 10 according to the sixth modification.

FIG. 16 is a timing chart showing each signal of the AD conversion apparatus 10 according to the sixth modification.

In the present modification, the pattern generating section 14 generates, as each pattern signal with a pulse width or number of pulses corresponding to the least significant bit, a pattern signal having a pulse that can be integrated by the integrating section 16. In the example shown in FIG. 16, the ratio of the pulse width to the bit weighting for pattern signals corresponding to the least significant bit is four times the ratio of the pulse width to the bit weighting for other pattern signals.

When a pattern signal having a pulse width or number of pulses corresponding to the least significant bit is generated, the gain setting section 64 changes the integral gain of the integrating section 16 such that the reference signal increases or decreases by the weighting of the least significant bit each time a pattern signal having a pulse width or number of pulses corresponding to the least significant bit is integrated.

The gain setting section 64 changes the integral gain in the integrating section 16 such that the product of the pulse width (or number of pulses) and the integral gain is proportional to the bit weighting. In the example of FIG. 16, the gain setting section 64 sets the integral gain for integrating the pattern signals corresponding to the least significant bit to be ¼ of the integral gain for integrating the pattern signals corresponding to the other bits.

In this way, the AD conversion apparatus 10 of the present modification can increase the pulse width of the pattern signals corresponding to the least significant bit. As a result, the AD conversion apparatus 10 can prevent the integrating section 16 from outputting a reference signal with low accuracy due to a small pulse width making the integrating section 16 unable to integrate the pattern signals.

Figure 17:
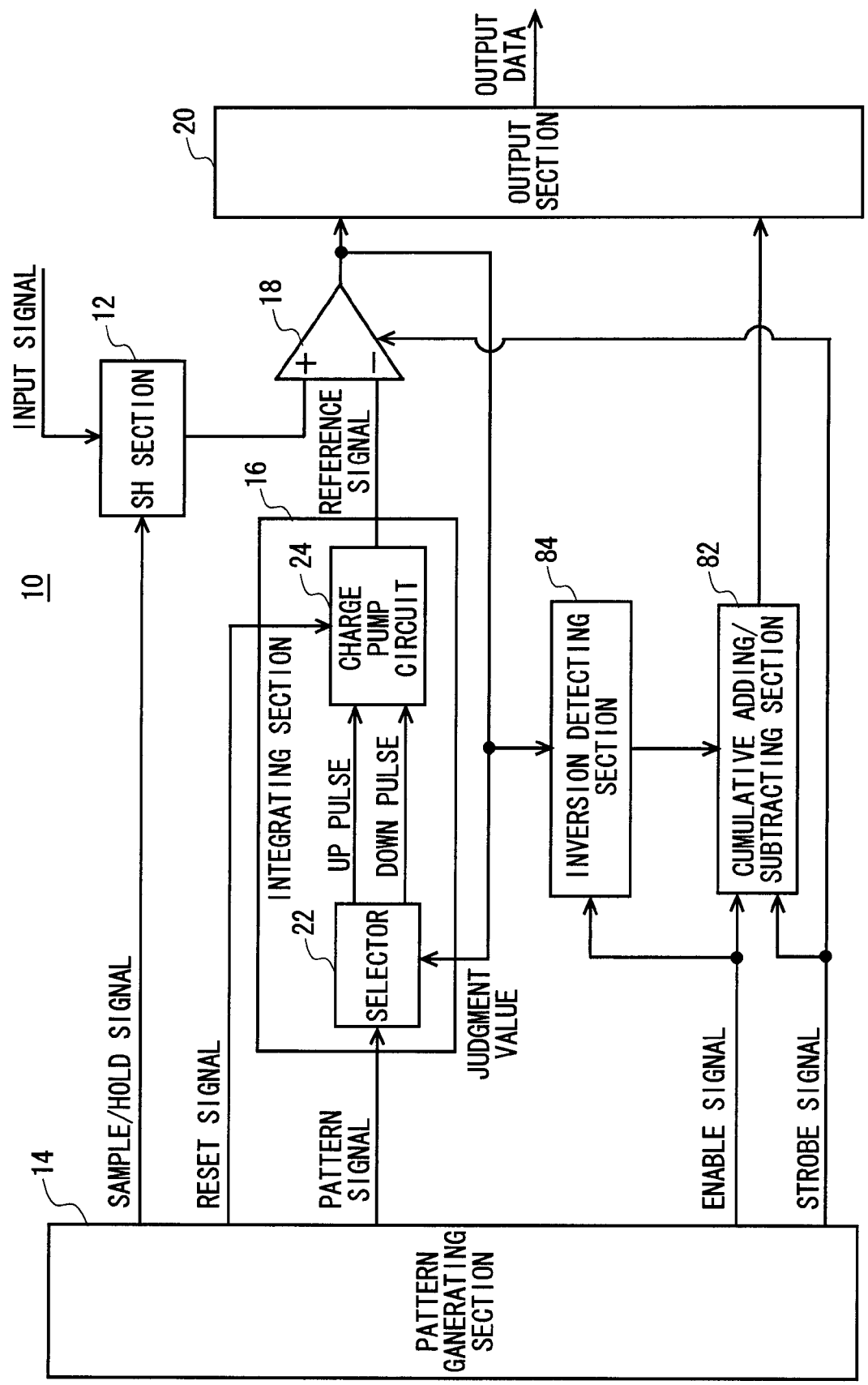
FIG. 17 shows an exemplary configuration of the AD conversion apparatus 10 according to a seventh modification of the present embodiment.

FIG. 17 shows a configuration of the AD conversion apparatus 10 according to a seventh modification of the present embodiment. The AD conversion apparatus 10 of the present modification has substantially the same function and configuration as the AD conversion apparatus 10 shown in FIG. 13, and therefore components having the same function and configuration as those shown in FIG. 13 are given the same reference numerals and the following description includes only differing points.

The AD conversion apparatus 10 of the present modification includes an inversion detecting section 86 instead of the gating circuit 80. The inversion detecting section 86 detects whether the comparison result output from the comparing section 18 is inverted. For example, the inversion detecting section 86 may detect whether the comparison result is inverted during the period in which the enable signal is output, i.e. during the period in which the pattern signals that each have a pulse width or number of pulses corresponding to the weighting of the least significant bit are being repeatedly generated.

The cumulative adding/subtracting section 82 increments or decrements the counter value from when the pattern generating section 14 begins generating the pattern signals having a pulse width or number of pulses corresponding to the weighting of the least significant bit to when the comparison results of the comparing section 18 are inverted.

In other words, the cumulative adding/subtracting section 82 begins incrementing or decrementing the counter value when the pattern signals having a pulse width or number of pulses corresponding to the weighting of the least significant bit begin being generated, and stops the incrementing or decrementing when the comparison results of the comparing section 18 are inverted.

In this way, the cumulative adding/subtracting section 82 can stop the incrementing or decrementing when the difference between the reference signal and the input signal becomes within the range of the weighting of the least significant bit. The AD conversion apparatus 10 of the present modification can eliminate the redundant processing of the cumulative adding/subtracting section 82.

Figure 18:
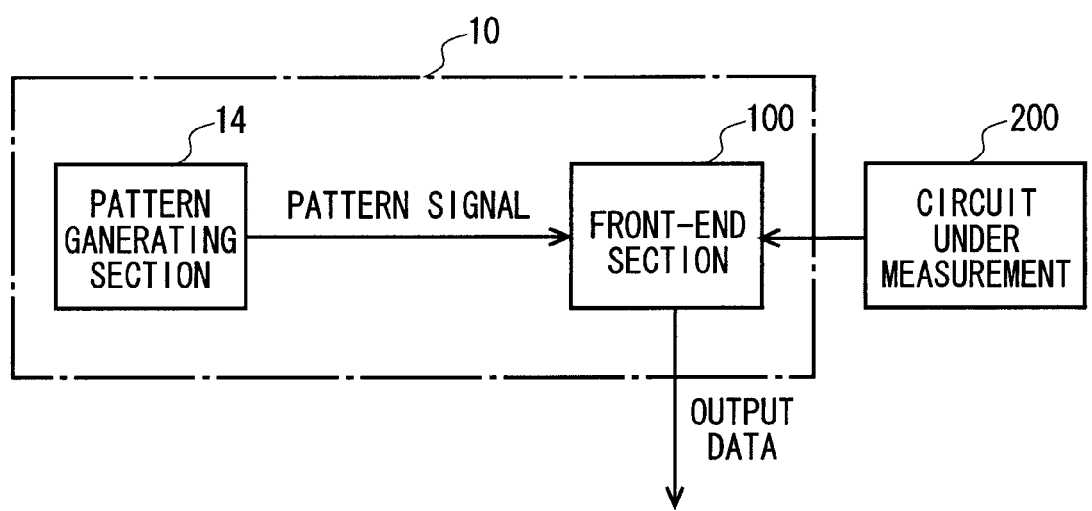
FIG. 18 shows an exemplary configuration of the AD conversion apparatus 10 according to an eighth modification of the present embodiment.

FIG. 18 shows a configuration of the AD conversion apparatus 10 according to an eighth modification of the present embodiment. The AD conversion apparatus 10 of the present modification has substantially the same function and configuration as any one of the AD conversion apparatuses 10 shown in FIGS. 1 to 14, and therefore components having the same function and configuration as those shown in FIGS. 1 to 14 are given the same reference numerals and the following description includes only differing points.

The AD conversion apparatus 10 of the present modification outputs output data corresponding to a signal output from a circuit under measurement 200. The AD conversion apparatus 10 of the present modification includes a pattern generating section 14 and a front-end section 100. The pattern generating section 14 has the same function and configuration as any one of the pattern generating sections 14 described in FIGS. 1 to 17.

The front-end section 100 has the same configuration as any one of the AD conversion apparatuses 10 described in FIGS. 1 to 17, aside from the exclusion of the pattern generating section 14. In other words, when the front-end section 100 has substantially the same function and configuration as the AD conversion apparatus 10 shown in FIG. 1, the front-end section 100 includes the sample/hold section 12, the integrating section 16, the comparing section 18, and the output section 20.

In the AD conversion apparatus 10 of the present modification, the pattern generating section 14 and the front-end section 100 are arranged at separate positions. If the AD conversion apparatus 10 is provided in a semiconductor test apparatus, the pattern generating section 14 may be arranged within a test head of the semiconductor test apparatus and the front-end section 100 may be arranged on a performance board, for example.

In the AD conversion apparatus 10, the pattern signal is supplied from the pattern generating section 14 to the front-end section 100 in one direction, and the comparison results, for example, are not fed back from the front-end section 100 to the pattern generating section 14. Accordingly, the AD conversion apparatus 10 of the present modification can decrease the wiring and the number of circuits used for transmission, even when the pattern generating section 14 and the front-end section 100 are arranged at separate positions.

The AD conversion apparatus 10 of the present modification can be arranged near the circuit under measurement 200. In this way, the AD conversion apparatus 10 of the present modification can perform an AD conversion with high accuracy by sampling the signal near the circuit under measurement 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A DA conversion apparatus that converts digital input data into an analog output signal, comprising:
   a pattern generating section that, for each target bit specified one bit at a time in the input data, generates a pattern signal having a pulse width or number of pulses corresponding to a weighting of the target bit; and
   an integrating section that integrates the pattern signals corresponding to values of the target bits to output the output signal obtained by accumulating the integrated value of each pattern signal from the most significant bit to the least significant bit of the input data.

2. The DA conversion apparatus according to claim 1, wherein
   each time a pattern signal is generated, the integrating section integrates the pattern signal using a sign corresponding to the value of the target bit.

3. The DA conversion apparatus according to claim 1, wherein
   the pattern generating section outputs a reset signal prior to the pattern signal corresponding to the value of the target bit, and
   when the reset signal is received, the integrating section resets the output signal to a minimum value or a maximum value of an input signal that can be input to the DA conversion apparatus, and integrates the pattern signal generated in correspondence with the value of the target bit according to a predetermined judgment value.

4. The DA conversion apparatus according to claim 1, wherein
   the pattern generating section generates a reset signal, instead of the pattern signal to be generated in correspondence with the value of the target bit, and
   when the reset signal is received, the integrating section resets the output signal to an intermediate value within a range of an input signal that can be input to the DA conversion apparatus.

5. The DA conversion apparatus according to claim 1, further comprising a gain setting section that, prior to the integration of each pattern signal, changes an integral gain in the integrating section according to a bit field of the bit corresponding to the pattern signal.

6. The DA conversion apparatus according to claim 5, wherein
   prior to the integration of each pattern signal, the gain setting section changes the integral gain in the integrating section according to a judgment value for judging a value of the bit corresponding to the pattern signal.

7. The DA conversion apparatus according to claim 1, further comprising an offset setting section that, prior to the integration of each pattern signal, changes an offset in the integrating section according to a bit field of the bit corresponding to the pattern signal.

8. The DA conversion apparatus according to claim 7, wherein
   prior to the integration of each pattern signal, the offset setting section changes the offset in the integrating section according to a judgment value for judging a value of the bit corresponding to the pattern signal.

9. The DA conversion apparatus according to claim 1, wherein the pattern generating section includes:
   a plurality of pattern generators that, for each bit field of the input data, each generate a pattern signal having a pulse width or number of pulses different from the pulse width or number of pulses of the pattern signals generated by the other pattern generators; and
   a selecting section that, prior to the generation of each pattern signal corresponding to a bit field, selects the pattern signal generated by one of the plurality of pattern generators to be output.

10. The DA conversion apparatus according to claim 1, wherein
    for each target bit specified one bit at a time moving downward in a high bit field spanning from the most significant bit to a predetermined bit in the input data, the pattern generating section generates a pattern signal having a pulse width or number of pulses corresponding to a weighting of the target bit, and then repeatedly generates pattern signal that each have a pulse width or number of pulses corresponding to the weighting of a least significant bit.

11. The DA conversion apparatus according to claim 10, wherein
    the pattern generating section generates, as a pattern signal having a pulse width or number of pulses corresponding to the weighting of the least significant bit, a pattern signal having a pulse width that can be integrated by the integrating section, and
    the DA conversion apparatus further comprises a gain setting section that changes the integral gain of the integrating section such that the reference signal increases or decreases by an amount equal to the weighting of the least significant bit each time a pattern signal having a pulse width or number of pulses corresponding to the weighting of the least significant bit is integrated.

* * * * *